United States Patent [19]

Koyama et al.

[11] Patent Number: 5,081,423
[45] Date of Patent: Jan. 14, 1992

[54] INTEGRATOR AND ACTIVE FILTER INCLUDING INTEGRATOR WITH SIMPLE PHASE COMPENSATION

[75] Inventors: Mikio Koyama, Yokohama; Hiroshi Tanimoto, Kawasaki, both of Japan

[73] Assignee: Kabushiki Kaisha Toshiba, Kawasaki, Japan

[21] Appl. No.: 385,305

[22] Filed: Jul. 26, 1989

[30] Foreign Application Priority Data

Jul. 28, 1988 [JP] Japan ................... 63-189154
Jul. 28, 1988 [JP] Japan ................... 63-189155
Jun. 30, 1989 [JP] Japan ................... 1-168876

[51] Int. Cl.⁵ ...................... G06G 7/18; H03K 5/00
[52] U.S. Cl. .................................. 328/127; 307/520; 328/167; 330/252
[58] Field of Search ............... 330/252, 253, 294, 9; 328/127, 167; 307/520

[56] References Cited

U.S. PATENT DOCUMENTS

| | | | |
|---|---|---|---|
| 3,986,127 | 10/1976 | Ray | 328/127 |
| 4,748,420 | 5/1988 | Metz | 330/149 |
| 4,808,942 | 2/1989 | Milkovic | 330/9 |
| 4,904,952 | 2/1990 | Tanimoto | 330/252 |

FOREIGN PATENT DOCUMENTS

| | | |
|---|---|---|
| 0234655 | 9/1987 | European Pat. Off. . |
| 0270156 | 6/1988 | European Pat. Off. . |
| 0312016 | 4/1989 | European Pat. Off. . |
| 0312017 | 4/1989 | European Pat. Off. . |
| 3527523 | 2/1987 | Fed. Rep. of Germany . |
| 58-161413 | 9/1983 | Japan . |
| 8602892 | 6/1988 | Netherlands . |
| 2061046 | 5/1981 | United Kingdom . |

OTHER PUBLICATIONS

Khorramabadi et al., "High-Frequency CMOS Continuous-Time Filters", IEEE Journal of Solid-State Circuits, vol. Sc-19, No. 6, Dec. 1984, pp. 939-948.
Proceedings of the International Symposium on Circuits and Systems, Kyoto, 5th-7th Jun. 1985, vol. 3, pp. 1427-1430, IEEE, New York, US; S. Masuda et al.: "A Monolithic Continuous-Time Low-Pass Filter".

Primary Examiner—Edward P. Westin
Assistant Examiner—Richard Roseen
Attorney, Agent, or Firm—Foley & Lardner

[57] ABSTRACT

In an integrator circuit having a wide linearity range, there are provided: a first emitter-coupled transistor pair having two bipolar transistors, emitter areas of the transistors being substantially equal to each other; a second emitter-coupled transistor pair having two bipolar transistors, emitter areas of said transistors being substantially equal to each other; first and second input terminals for receiving an input voltage respectively; a first output terminal to which a first collector of the first emitter-coupled pair and also a first collector of the second emitter-coupled transistor pair of commonly connected; a second output terminal to which a second collector of the first emitter-coupled transistor pair and also a second collector of the second emitter-coupled transistor pair are commonly connected; first DC-voltage applying means connected to the first input terminal, for applying a first offset DC (direct current) voltage having a predetermined level between a first base electrode of the first emitter-coupled transistor pair and a first base electrode of the second emitter-coupled transistor pair; second DC-voltage applying means connected to the second input terminal, for applying a second offset DC voltage having the same level but an opposite polarity to that of the first offset DC voltage between a second base electrode of the first emitter-coupled transistor pair and a second base electrode of the second emitter-coupled transistor pair; and, capacitance means connected between the first and second output terminals.

29 Claims, 22 Drawing Sheets

INTEGRATOR AND ACTIVE FILTER INCLUDING INTEGRATOR WITH SIMPLE PHASE COMPENSATION

BACKGROUND OF THE INVENTION

1. Field of the Invention

The present invention relates to an integrator circuit having a DC offset circuit and to an active filter including such integrator circuits with a phase compensation by a resistor. More specifically, the present invention is directed to an RF active filter operable in a video frequency field.

2. Description of the Related Art

Very recently, active filters are constructed by employing differential amplifier circuits, and then fabricated in integrated circuits.

In particular, RF (radio frequency) active filters operable in high frequencies with having the frequency band of more than several MHz are expected in the fields; e.g., video signal circuits, High Definition Television circuits and CATV (cable television network) systems.

Various proposals have been made in integrator circuits constituting the conventional active filters. In Japanese KOKAI (Disclosure) patent application No. 58-161413 opened on Sept. 26, 1983, there is disclosed an integrator circuit as illustrated in FIG. 1.

In the conventional integrator circuit, after the signal $V_{IN}$ inputted to the input terminal 55 is amplified by the first differential amplifier circuit "A" which has been linearized by the resistors 56 and 57, the amplied input signal is supplied to the second differential amplifier circuit "B" constructed of the transistors $Q_{25}$ and $Q_{26}$, and then the signal which has been integrated by the capacitor 58 is output to the output terminal 59 ($V_{OUT}$).

Considering various performances required for a typical integrator circuit for constituting an active filter, an ideal integrator circuit includes a first pole at a very low frequency, and neither other poles nor a zero point. However, since an actual integrator circuit contains a plurality of poles and also a zero point due to a certain limitation in performances of transistors employed therein, a satisfactory active filter can be constructed only under the severe conditions that these poles and zero point are set at such a higher frequency than a cutoff frequency of the active filter by more than 50 to 100 times.

Under the known technical backgrounds, when an active filter having a cutoff frequency of, for instance, 10 MHz, e.g., a lowpass filter, a highpass filter, or a bandpass filter is constructed, a second pole and also a zero point must be designed at a high frequency such as 500 MHz to 1 GHz. In other words, to manufacture the active filter having the satisfactory performances, a specific care must be taken to a very high frequency with respect to the operating frequency of this active filter.

In, on the other hand, the conventional integrator circuit shown in FIG. 1, considerably high resistance values are selected as the emitter resistors 56 and 57 of the transistors $Q_{23}$ and $Q_{24}$ of the first differential amplifier "A" in order to maintain the better linearity. That is to say, to linearize the non-linearity of the transistors $Q_{23}$ and $Q_{24}$ employed in the first differential amplifier circuit "A" by way of the resistors 56 and 57, the resistance values of these resistors 56 and 57 must be selected to be significantly higher than the equivalent resistance "1/gm (mutual conductance)" of these transistors $Q_{23}$ and $Q_{24}$.

Furthermore, it is obvious that since the temperature dependent characteristic of the transconductance Gm of the first differential amplifier circuit "A" constructed of the above-described transistors $Q_{23}$, $Q_{24}$ and resistors 56, 57 is influenced by both the first temperature dependent characteristic of the bipolar transistors $Q_{23}$ and $Q_{24}$, and also the second temperature dependent characteristic of the resistors, a simple temperature compensation circuit can hardly compensate for such temperature dependent characteristics. As a consequence, as a generic solution, the transconductance Gm is mainly influenced by the resistors, because the effect of the temperature dependency thereof is rather small. In a typical example, the resistance values of the resistors 56 and 57 are selected to be 2 to 4 killohms. Accordingly, the signal $V_{IN}$ inputted to the input terminal 55 is attenuated to, for instance, approximately 20 dB and then input to the base electrodes of the transistors $Q_{25}$ and $Q_{26}$.

As a consequence, the resultant transconductance Gm is extremely lowered in the overall integrator circuit even if the transistors having the high mutual conductance "gm" are employed. In addition, since a quality factor (Q) of an active filter having a higher quality factor is drastically changed at higher frequencies depending upon parameters of circuit elements thereof, a specific Q-controlling circuit is necessarily required in the conventional integrator circuit shown in FIG. 1.

Then, as previously described, since the temperature dependent characteristic of the transconductance "Gm" of the overall integrator circuit is determined by both the first and second temperature dependent characteristics of the bipolar transistors $Q_{23}$ and $Q_{24}$, and resistors 56 and 57, this temperature dependency cannot be correctly cancelled, or compensated.

As the base of the transistor $Q_{24}$ is grounded in an AC sense in the first differential amplifier circuit "A", the input signal $V_{IN}$ supplied to the input terminal 55 is output via the emitter follower circuit arranged by one transistor $Q_{23}$ and also the base-grounded circuit of the other transistor $Q_{24}$. However, assuming the differential input and differential output, this differential amplifier circuit "A" may be considered as a half circuit in view of also the frequency characteristics. As illustrated in FIGS. 2 and 3, this differential amplifier circuit "A" has equivalently the characteristic of the single-staged emitter grounded circuit. In the circuit shown in FIG. 3, no resistor is included. However, as previously described one end of this circuit is grounded in an AC sense, the resultant equivalent circuit becomes complex, so that the above-described unnecessary poles as well as zero point are induced, which deteriorates the frequency characteristic. Furthermore, the input signal $V_{IN}$ passes through two stages of the first and second differential amplifier circuits "A" and "B", which also causes such a problem that the frequency characteristic is flowered.

In the differential amplifier circuit shown in FIG. 1, a PNP transistor $Q_{27}$ is employed as the load resistor, i.e., an active load, the overall DC gain is calculated by multiplying the output resistor $r_{01}$ of the transistor $Q_{27}$ by the transconductance "Gm". However, the resistance value of the output resistor $r_{01}$ is inherently determined by the manufacturing process of the entire integrator circuit. In other words, since this resistance value cannot be freely set, the resultant frequency characteristic is lowered.

Also, a monolithic active filter operable under the high frequency ranges of 100 kHz to 10 MHz of the IF filtering and video processing circuits of the TV circuit with utilizing the CMOS technology is disclosed in "High-Frequency CMOS Continuous-Time Filters" of IEEE JOURNAL OF SOLID-STATE CIRCUITS, VOL. Sc-29 No. 6, December 1984 by HAIDEH KHORRAMABADI et al., from pages 939 to 948. In the described conventional active filter, the phase compensation is carried out to properly set the DC gain of the integrator by designing dimensions of the MOSFETS employed therein.

However, there are the following problems in the above-described conventional integrator circuits and active filters.

That is, in accordance with the conventional active filter employing the conventional integrator circuits shown in FIG. 1, since this active filter is arranged by the first differential amplifier circuit "A" which has been linearized by the resistors 56 and 57 having the relatively large resistance values, and also the second differential amplifier circuit "B" in which the PNP transistor $Q_{27}$ is connected as the active load for this amplifier circuit, the resultant transconductance "Gm" of the entire integrator circuit is low and therefore this active filter cannot be satisfactorily operated in the high frequency range.

As previously described, the temperature dependent characteristic of the transconductance "Gm" of the entire integrator circuit is determined by both the first temperature dependent characteristic of the transistors $Q_{23}$ and $Q_{24}$ for constituting the first differential amplifier circuit "A" and the second temperature dependent characteristic of the resistors 56 and 57. As a result, it is very difficult that the temperature dependent characteristic of the transconductance "Gm" is correctly compensated.

Also it is known that a specific Q(quality factor)-control circuit means is required in the RF active filter having the high quality factor because this quality factor in significantly changed by the parameters of the circuit elements employed in the conventional integrator circuit shown in FIG. 1.

Then, as in the first differential amplifier circuit "A" at the input stage, the base electrode of the transistor $Q_{24}$ is grounded, the equivalent circuit thereof becomes complex, and thus the unnecessary poles and zero point are produced. As a result, the frequency characteristic of the entire differential amplifier circuits is also deteriorated in view of this technical point.

In, on the other hand, the above-described CMO type monolithic active filter, there is another problem that the complex and high-cost phase compensation must be introduced.

SUMMARY OF THE INVENTION

The present invention has been made in an attempt to solve the above-described conventional problems, and therefore, has a primary object to provide an integrator circuit suitable for an RF active filter, which owns the wide linearity range while utilizing differential amplifiers operable at a high speed.

Furthermore, the present invention has a secondary object to provide an active filter capable of controlling a quality factor without employing an additional Q-controller, the transconductance "Gm" of which is large and also the temperature dependent characteristic of which can be properly cancelled.

To achieve the above-described primary object of the invention, an integrator circuit comprises:

a first emitter-coupled transistor pair (10) having two bipolar transistors ($Q_3$: $Q_4$), emitter areas of said transistors ($Q_3$: $Q_4$) being substantially equal to each other;

a second emitter-coupled transistor pair (20) having two bipolar transistors ($Q_5$: $Q_6$), emitter areas of said transistors ($Q_5$: $Q_6$) being substantially equal to each other;

first and second input terminals (8: 9) for receiving an input voltage ($V_{IN}$) respectively;

a first output terminal (OUT1) to which a first collector (1) of said first emitter-coupled pair (10) and also a first collector (2) of said second emitter-coupled transistor pair (20) are commonly connected;

a second output terminal (OUT2) to which a second collector (3) of said first emitter-coupled transistor pair (10) and also a second collector (4) of said second emitter-coupled transistor pair (20) are commonly connected;

first DC-voltage applying means (16: 17) connected to said first input terminal (8), for applying a first offset DC (direct current) voltage having a predetermined level between a first base electrode (11) of said first emitter-coupled transistor pair (10) and a first base electrode (12) of said second emitter-coupled transistor pair (20);

second DC-voltage applying means (18: 19) connected to said second input terminal (9), for applying a second offset DC voltage having the same level but an opposite polarity to that of said first offset DC voltage between a second base electrode (14) of said first emitter-coupled transistor pair (10) and a second base electrode (13) of said second emitter-coupled transistor pair (20); and, capacitance means (7) connected between said first and second output terminals ($OUT_1$; $OUT_2$y).

Furthermore, in order to achieve the secondary object of the invention, an active filter comprises:

an n-set ("n" being an integer equal to, or more than 2) of emitter-coupled transistor pairs (40), each having two bipolar transistors ($Q_{43}$: $Q_{46}$: $P_1$: $P_n$: $U_1$: $U_n$), emitter areas of said transistors ($Q_3$: $Q_6$: $P_1$: $P_n$: $U_1$: $U_n$) being substantially equal to each other;

an emitter current source (53: CS) commonly connected to all of emitters of said emitter-coupled transistor pairs (40);

first and second output terminals ($OUT_1$: $OUT_2$) connected to two collectors (41: 42) of one set of said emitter-coupled transistor pair (40);

drive means (14: 16: $S_1$: $S_n$: $T_1$: $T_n$) connected between said first and second input terminals (8: 9), and said n-set of emitter-coupled transistor pairs (40), for producing an n-piece of AC (alternating current) signals having the same phase with each other but different amplitudes, to which different DC voltages have been superimposed, from said input signal ($V_{IN}$), and for supplying said n-piece of AC signals to each base electrode (48: 52) of said n-set of emitter-coupled transistor pairs (40); and, capacitance means (45) connected between said first and second output terminals ($OUT_1$: $OUT_2$).

BRIEF DESCRIPTION OF THE DRAWINGS

For a better understanding of the present invention, reference is made to the following descriptions in conjunction with the accompanying drawings, in which.

DETAILED DESCRIPTION OF THE PREFERRED EMBODIMENTS

Circuit Arrangement of First Integrator

First, a circuit arrangement of an integrator 100 according to a first preferred embodiment of the invention will now be described so as to achieve the above-described primary object of the invention.

It should be noted that this integrator 100 is mainly constructed of a differential amplifier having better linearity characteristics or wider linearity range.

Figure 4A:
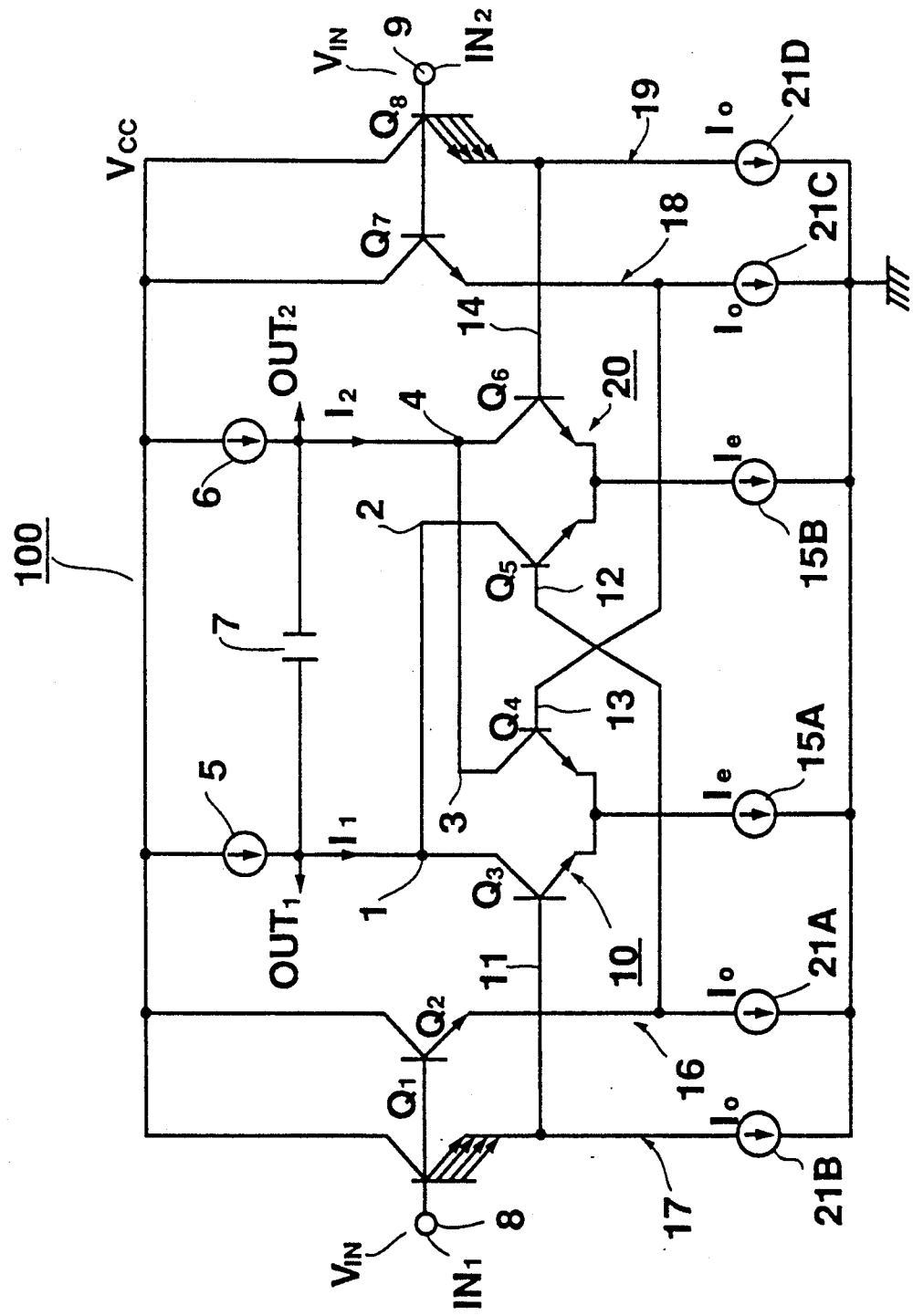
FIGS. 4A to 4C are circuit diagrams of integrator circuits 100–300 according to first to third preferred embodiments of the invention, in which first type differential amplifiers having a wide linearity range are employed so as to achieve a primary object of the invention.

In FIG. 4A, there is shown a basic arrangement of a first integrator circuit 100 according to the first preferred embodiment of the invention. Two pairs of NPN transistors $Q_3$; $Q_4$ and $Q_5$; $Q_6$ having same emitter areas with each other are employed to form a first emitter-coupled transistor pair 10 and a second emitter-coupled transistor pair 20. To two junction points of common emitters of the first and second emitter-coupled transistor pairs 10 and 20, constant current sources 15A and 15B capable of flowing a constant current "$I_C$" are connected as an emitter current source.

A first collector 1 of the above-described first emitter-coupled transistor pair 10 is connected another first collector 2 of the above-described second transistor pair 20. To a common junction point of these collector 1 and 2, a collector current source 5 is connected. Similarly, a second collector 3 of the first emitter-coupled transistor pair 20 is connected to a second collector 4 of the second emitter-coupled transistor pair 20. Another collector current source 6 is connected to a common junction point between these collectors 3 and 4.

A capacitor 7 is connected to a common junction point between the above-described collector junction points as a load to the first and second transistor pairs 10 and 20.

Two sets of emitter follows are provided in parallel to each of the first and second transistor pairs 10 and 20 as an offset driving means in order to improve the linearity of the integrator circuit 100. That is, these emitter followers are constructed of two transistors having a ratio of emitter areas "1:4" and connected to two input terminals 8 and 9 denoted by $IN_1$ and $IN_2$. These emitter followers functioning as the driving means are to supply a predetermined offset current to each of output currents of the first and second emitter-coupled transistor pairs 10 and 20.

Precisely speaking, two sets of first and second emitter followers 16 and 17 employing two transistors $Q_1$ and $Q_2$ are connected in a parallel form to one input terminal 8 of the first integrator circuit 100. These transistors $Q_1$ and $Q_2$ have emitter areas whose ratio is selected to be "1:4". Two constant current sources 21A and 21B each flowing a constant current "$I_o$" are connected to the corresponding emitter circuits of the first and second emitter followers 16 and 17. An emitter output of the first emitter follower 16 is connected to a first base 12 of the second emitter-coupled transistor pair 20, whereas an emitter output of the second emitter follower 17 is connected to a first base 11 of the first emitter-coupled transistor pair 10.

Similarly, third and fourth emitter followers 18 and 19 are connected in parallel form to the other input terminal 9 of the first integrator circuit 100. These emitter followers 18 and 19 are constructed of two transistors $Q_7$ and $Q_8$ respectively. A ratio of emitter areas thereof is designed to be 1:4. Also, constant current sources 21C and 21D capable of each flowing a constant current "$I_o$" are connected to an emitter circuit of each of the third and fourth emitter followers 18 and 19. An emitter output of the third emitter follower 18 is connected to a second base 13 of the first emitter-coupled transistor pair 10, whereas an emitter output of the fourth emitter follower 19 is connected to a second base 14 of the second emitter-coupled transistor pair 20.

Operation of First Integrator

As previously described, according to the differential amplifier circuits for constituting the first integrator circuit 100, the emitter area of the transistor $Q_1$ in the second emitter follower 17 connected to one input terminal 8 is four times larger than that of the transistor $Q_2$, but the same leveled constant currents "$I_o$" flow through the emitter circuits thereof. As a result, base-emitter voltages "$V_{be1}$, $V_{be2}$" of these transistors $Q_1$ and $Q_2$ are expressed by:

$$V_{be1} = V_T ln\, (I_c/4I_s) \quad (1)$$

$$V_{be2} = V_T ln\, (I_c/I_s) \quad (2)$$

where
Is: saturation current of transistor
Ic: collector current of transistor

Vt: thermal voltage.

Further, a potential difference $V_{be}'$ between the base-emitter voltage $V_{be1}$ of the transistor $Q_1$ and base-emitter voltage $V_{be2}$ of the transistor $Q_2$ is obtained as follows:

$$V_{be}' = V_t \cdot ln4 \qquad (3)$$

Accordingly, as a result of this voltage difference $V_{be}'$ between these base-emitter voltages $V_{be1}$ and $V_{be2}$, a DC offset voltage having a predetermined level is applied to the first base 11 of the first emitter-coupled transistor pair 10 between the first base 11 of the first emitter-coupled transistor pair 10 and the first base 12 of the second emitter-coupled transistor pair 20. As a consequence, this is equal to that a DC offset voltage having a desired level is applied to one input terminal 8.

Similarly, another DC offset voltage having a predetermined level is applied to the second base 13 of the first emitter-coupled transistor pair 10. However, the polarity of this DC offset voltage is opposite to that of the first-mentioned DC offset voltage being applied to one input terminal 8. This implies that the DC offset voltage having the predetermined level is equivalently applied to the other input terminal 9.

With the above-described DC offset effects applied to both input terminals 8 and 9, an offset effect of 1:4 is present in the output currents of the first and second emitter-coupled transistor pairs 10 and 20, and then these offset output currents are multiplied with each other so as to flow the currents $I_1$ and $I_2$ after multiplications through the respective current sources 5 and 6. As a consequence, the non-linearity of the employed bipolar-transistor can be improved. The Applicants confirmed that the signal distortion of the first integrator circuit 100 reached approximately 1% at an input signal having a level of 100 mV (peak-to-peak), without employing such emitter registers 56, 57 as in the conventional integrator circuit shown in FIG. 1 for linearity improvement purposes. Furthermore, it could be confirmed that a range of the linearity of the differential amplifier circuit having the above-described offset emitter followers was extended approximately 3 times, as compared with that of the conventional differential amplifier circuit having no linearity-improving means, and also this differential amplifier circuit has a transconductance "Gm" that is about ⅔ of a mutual conductance "gm" of an emitter-grounded transistor. Then, according to the present invention, both the improved linearity and higher transconductance "Gm" can be realized with a single stage differential amplifier circuit.

Circuit Arrangement of Second Integrator

Figure 4B:
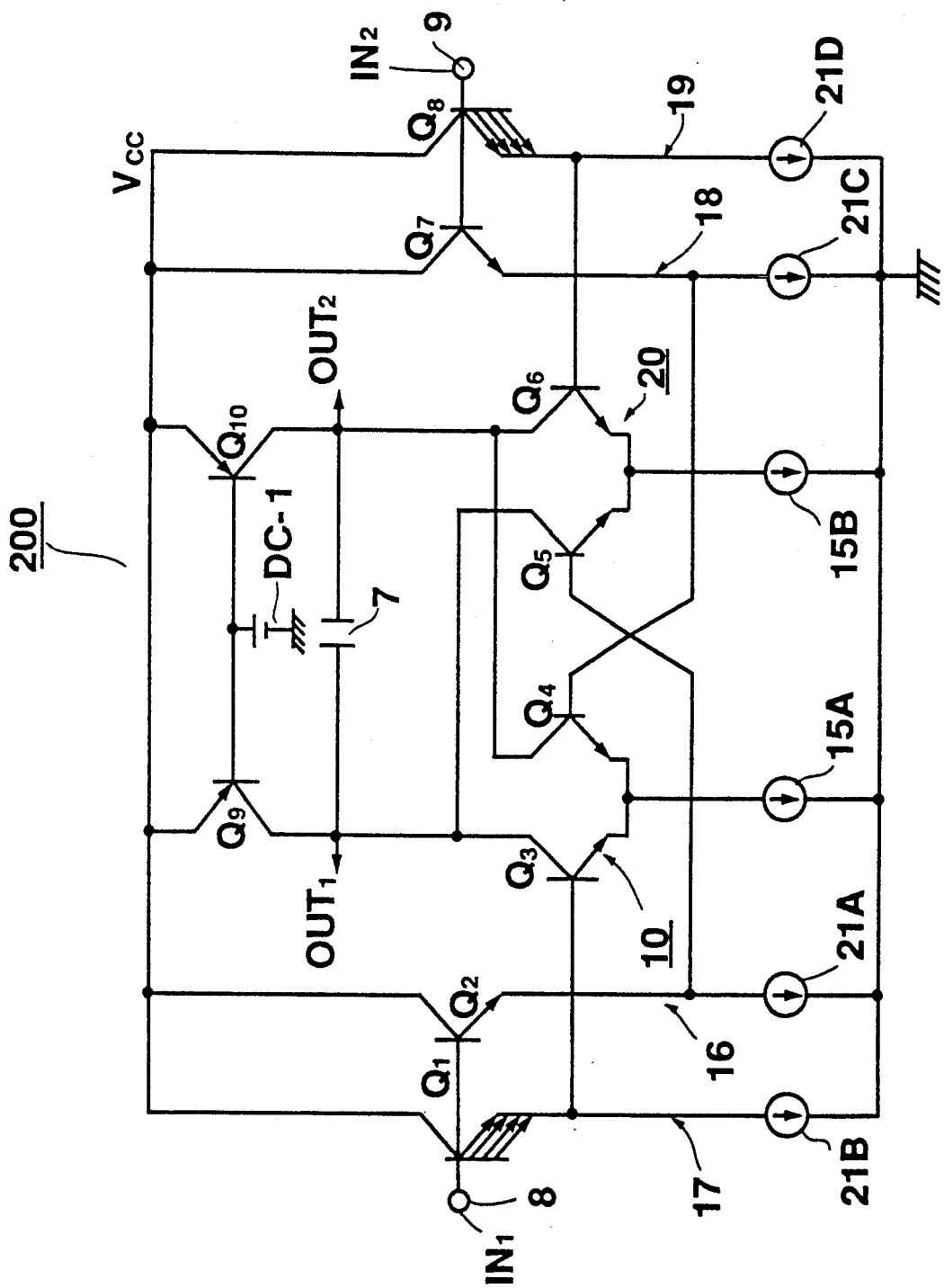

Referring now to FIG. 4B, an integrator circuit 200 according to a second preferred embodiment of the invention will be described.

As is apparent from FIG. 4B, since a circuit arrangement of the second integrator circuit 200 is substantially the same as that of the first integrator circuit 100, only a different circuit arrangement will be described.

Briefly speaking, the second integrator circuit 200 shown in FIG. 4B is so arranged that the collector current sources 5 and 6 in the first integrator circuit 100 shown in FIG. 4A are constructed by employing PNP transistors $Q_9$ and $Q_{10}$, and also a bias power source DC1.

A feature of the second integrator circuit 200 is similar to that of the first integrator circuit 100, namely the higher transconductance Gm and better compensation for the temperature dependent characteristic.

Circuit Arrangement of Third Integrator

Figure 4C:
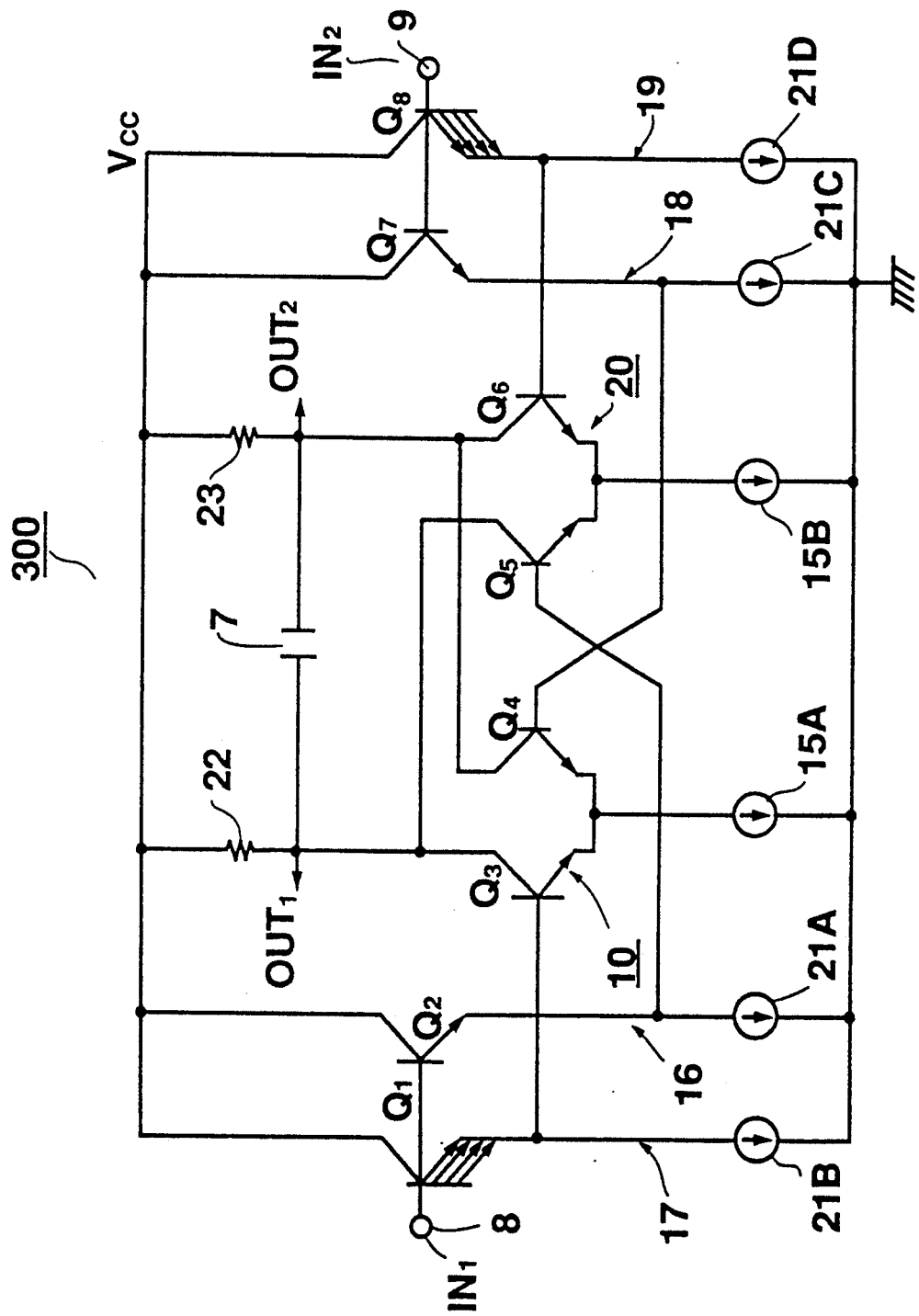

In FIG. 4C, there is shown an integrator circuit 300 according to a third preferred embodiment of the invention. It should be noted that the same reference numerals of FIG. 4A indicate the same or similar circuit elements shown in FIG. 4C, and therefore no further explanation thereof is made.

Simply speaking, the second integrator circuit 300 shown in FIG. 4C is so constructed that the collector power sources 5 and 6 of the first integrator circuit 100 are arranged by employing registers 22 and 23 in order to improve the frequency characteristics.

Consequently, features of the third integrator circuit 300 are as follows. That is, a delay in a phase of a second pole is cancelled by setting a DC gain to a finite value, i.e., a phase lead so that a shift in the frequency at which the gain becomes 0 dB can be corrected.

Now, it is assumed, as one example, that a bandpass filter having a central frequency of "fo" and a quality factor "Q" of 20 is constructed. It should be noted that a bandpass filter utilizing the third integrator circuit 300 will be discussed later.

If the shift in the pass-band characteristic of this bandpass filter is limited within +2 dB as compared with the ideal bandpass filter having no second pole, the frequency of the second pole in the integrator circuit must be selected to be 200 times higher than the central frequency "fo" thereof. This implies that this non-ideal bandpass filter must satisfy very severe conditions.

However, even if the frequency of the second pole is set to be, for instance, 50 times higher than the central frequency "fo" of a bandpass filter, there is a solution for setting the pass-band characteristic thereof within +1 dB. This solution is such that since a DC gain is selected to be 50, a shift in a frequency at which the gain becomes 0 dB can be completely corrected. It should be noted that since a frequency of a second pole of an integrator circuit is determined by an inherent characteristic of elements employed in this integrator circuit, the DC gain must be set to cancel such a frequency shift.

It should be understood that since the DC gain is inherently determined by the Early voltages of the bipolar transistors $Q_9$ and $Q_{10}$ in the second integrator circuit 200 in which the collector current sources are arranged by employing the PNP bipolar transistors $Q_9$ and $Q_{10}$, the DC gain cannot be freely adjusted depending upon the frequency of the second pole. However, in the third integrator circuit 300 shown in FIG. 4C, since resistance values of the resistors 22 and 23 in the collector circuits of the first and second emitter-coupled transistor pairs 10 and 20 can be freely designed by the manufacturing process of the IC chip, the above-described solution can be realized. In particular, in case that a filter having a higher Q (quality factor) is constructed of employing an integrator circuit, such a 2nd pole shift compensation according to the invention becomes significantly important because the quality factor control thereof is rather difficult in the conventional filter circuit.

Circuit Arrangement of Fourth Integrator

Then, an integrator circuit 400 according to a fourth preferred embodiment of the invention will now be described with reference to FIG. 5A. It should be noted that the fourth integrator circuit 400 is to achieve the above-described primary object, similar to the previous integrator circuits 100 and 300.

Figure 5A:
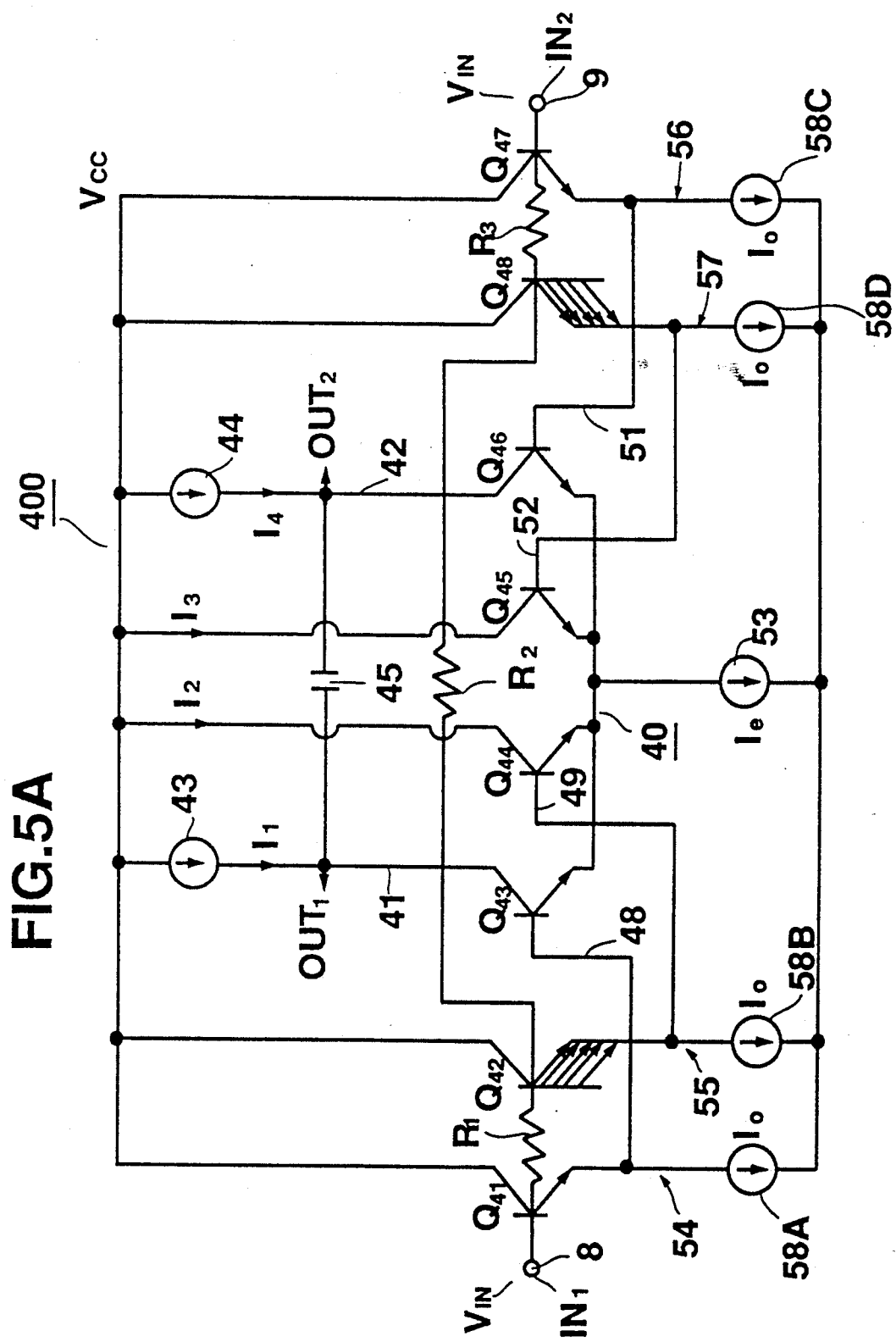
FIGS. 5A to 5C are circuit diagrams of integrator circuits 400–600 according to fourth to sixth preferred embodiments of the invention, in which second type differential amplifiers having a wide linearity range are employed so as to achieve the primary object of the invention.

In FIG. 5A, there is shown a basic arrangement of the fourth integrator circuit 400 according to the fourth preferred embodiment of the invention. Four NPN transistors $Q_{43}$, $Q_{44}$, $Q_{45}$, $Q_{46}$, having same emitter areas with each other are employed with commonly connected emitters to form a signal emitter-coupled transistor pair 40. To a common junction point of common emitters of the emitter-coupled transistor pair 40, a constant current source 53 capable of flowing a constant current "$I_C$ is connected as an emitter current source.

A first collector 41 of the above-described emitter-coupled transistor pair 40 is connected a first collector current source 43. To a common junction point of these collector 1 and 2, a collector current source 5 is connected. Similarly, a second collector 42 of the emitter-coupled transistor pair 40 is connected to a second collector current source 44.

A capacity 45 is connected between the above-described first and second collectors 41 and 42.

Four sets of emitter follows 54 to 57 are provided in parallel to the emitter-coupled transistor pair 40 as an offset driving means in order to improve the linearity of the integrator circuit 400. That is, these emitter followers are constructed of two transistors having a ratio of emitter areas "1:5" and connected to two input terminals 8 and 9 denoted by $IN_1$ and $IN_2$. These emitter followers functioning as the driving means are to supply a predetermined offset current to each of output currents of the emitter-coupled transistor pair 40.

Precisely speaking, two sets of first and second emitter followers 54 and 55 employing two transistor $Q_{41}$ and $Q_{42}$ are connected in a parallel form to one input terminal 8 of the fourth integrator circuit 400. These transistors $Q_{41}$ and $Q_{42}$ have emitter areas whose ratio is selected to be 1:5. Two constant current sources 58A and 58B each flowing a constant current "$I_o$" are connected to the corresponding emitter circuits of the first and second emitter followers 54 and 55. An emitter output of the first emitter follower 54 is connected to a first base 48 of the emitter-coupled transistor pair 40, whereas an emitter output of the second emitter follower 55 is connected to a first base 49 of this emitter-coupled transistor pair 40.

Similarly, third and fourth emitter followers 56 and 57 are connected in parallel form to the other input terminal 9 of the fourth integrator circuit 400. These emitter followers 56 and 57 are constructed of two transistors $Q_{47}$ and $Q_{48}$ respectively. A ratio of emitter areas thereof is designed to be 1:5. Also, constant current sources 58C and 58D capable of each flowing a constant current "$I_o$" are connected to an emitter circuit of each of the third and fourth emitter followers 56 and 57. An emitter output of the third emitter follower 56 is connected to a first base 51 of the emitter-coupled transistor pair 40, whereas an emitter output of the fourth emitter follower 57 is connected to a second base 52 of the emitter-coupled transistor pair 40. A resistor $R_1$ is connected between the bases of the transistors $Q_{41}$ and $Q_{42}$ of the first and second emitter followers 54 and 55. A resister $R_2$ is connected between the bases of the transistors $Q_{42}$ and $Q_{48}$. Further, a resistor $R_3$ is connected between the bases of the transistors $Q_{47}$ and $Q_{48}$ of the third and fourth emitter followers 56 and 57. An AC component contained in the input signal $V_{IN}$ is subdivided by these registers $R_1$ to $R_3$ and the subdivided input voltages are input to the bases of the respective transistors. A resistance value ratio of these resistors $R_1$ to $R_3$ is selected as follows:

$$R_1 (=R_3):R_2 = 5:8.$$

Operation of Fourth Integrator

As previously described, according to the differential amplifier circuits for constituting the fourth integrator circuit 400, the emitter area of the transistor $Q_{41}$ in the first emitter follower 54 connected to one input terminal 8 is five times larger than that of the transistor $Q_{42}$, but the same leveled constant currents "$I_o$" flow through the emitter circuits thereof. As a result, base-emitter voltages "$V_{BE1}$, $V_{BE2}$" of these transistors $Q_{41}$ and $Q_{42}$ are expressed by:

$$V_{BE1} = V_T \ln (I_c/I_s) \qquad (4)$$

$$V_{BE2} = V_T \ln (I_c/5I_s) \qquad (5)$$

where
Is: saturation current of transistor
Ic: collector current of transistor
Vt: thermal voltage.

Further, a potential difference $V'_{BE}$ between the base-emitter voltage $V_{BE1}$ of the transistor $Q_{41}$ and another base-emitter voltage $V_{BE2}$ of the transistor $Q_{42}$ is obtained as follows:

$$V_{BE}' = Vt \cdot \ln 5 \qquad (6)$$

In the fourth integrator circuit 400 as represented in FIG. 5A, collector currents $I_1$, $I_2$, $I_3$, and $I_4$ of the emitter-coupled transistors $Q_{43}$, $Q_{44}$, $Q_{45}$ and $Q_{46}$ and base-emitter voltages $V_{BE3}$, $V_{BE4}$, $V_{BE5}$ and $V_{BE6}$ of these transistors are represented by:

$$I_1 = I_s \cdot exp\ (V_{BE3}/V_T)$$

$$I_2 = I_s \cdot exp\ (V_{BE4}/V_T)$$

$$I_3 = I_s \cdot exp\ (V_{BE5}/V_T)$$

$$I_4 = I_s \cdot exp\ (V_{BE6}/V_T) \qquad (7)$$

Accordingly, $$I_1/I_2 = exp\ \{(V_{BE3} - V_{BE4})/V_T\} \qquad (8)$$

This equation (8) is thus expressed by the following equation (9) under the conditions that the potential difference $V_{BE2}'$ between the above-described base-emitter voltages $V_{BE1}$ and $V_{BE2}$ of the emitter follower transistors $Q_{41}$ and $Q_{42}$:

$$\begin{aligned} I_1/I_2 &= exp\{(((V_{IN}/2) \cdot \\ & R_1/(R_1 + (R_2/2))) - V_T \cdot \ln 5)/V_T\} \\ &= exp\{((V_{IN}/2) \cdot \\ & R_1/(R_1 + (R_2/2)))/V_T\} \cdot \{exp(\ln 5)\}^{-1}. \end{aligned}$$

Therefore, $$I_1/(I_2/5) = exp\{((V_{IN}/2) \cdot R_1/(R_1 + (R_2/2)))/V_T\} \qquad (9)$$

Similarly, the ratio of $I_3$ to $I_4$ is calculated as follows:

$$(I_3/5)/I_4 = exp\{((V_{IN}/2) \cdot R_3/(R_3+(R_2/2)))/V_T\} \quad (10)$$

Now, when the AC component of the input signal $V_{IN}$ is small, for instance, $V_{IN}=0$, all of the base voltages of the transistors $Q_3$ to $Q_6$ are equal to each other, and these emitter currents are directly proportional to the emitter areas of these transistors. Thus, the following equation is obtained:

$$I_1 = I_4 = Ie/12$$

$$I_2 = I_3 = 5 \cdot Ie/12 \quad (11)$$

As a consequence, when the AC component in the input signal $V_{IN}$ is small, the collector currents of the transistors $Q_{43}$ and $Q_{46}$ become small. In other words, the mutual conductance "gm" is small. To the contrary, when the input voltage $V_{IN}$ is large, the ratio of $I_1$ to $I_5$ is expressed by:

$$I_1/(I_2/5) = exp\{((V_{IN}/2) \cdot R_1/(R_2/2))/V_T\} \quad (12)$$

This implies that since the exponential function on the voltage-to-current characteristic of the transistor gives mainly the influence rather than the ratio of the emitter areas of this transistor, the collector current $I_1$ of the transistor $Q_{43}$ in the emitter-coupled transistor pair 40 is directly proportional to the current $I_2$ of the transistor $Q_{44}$, i.e., furthermore increased so that the transistors are operated in the AB class mode where the mutual conductance "gm" becomes large.

Input/Output Characteristic of Fourth Integrator

Figure 6:
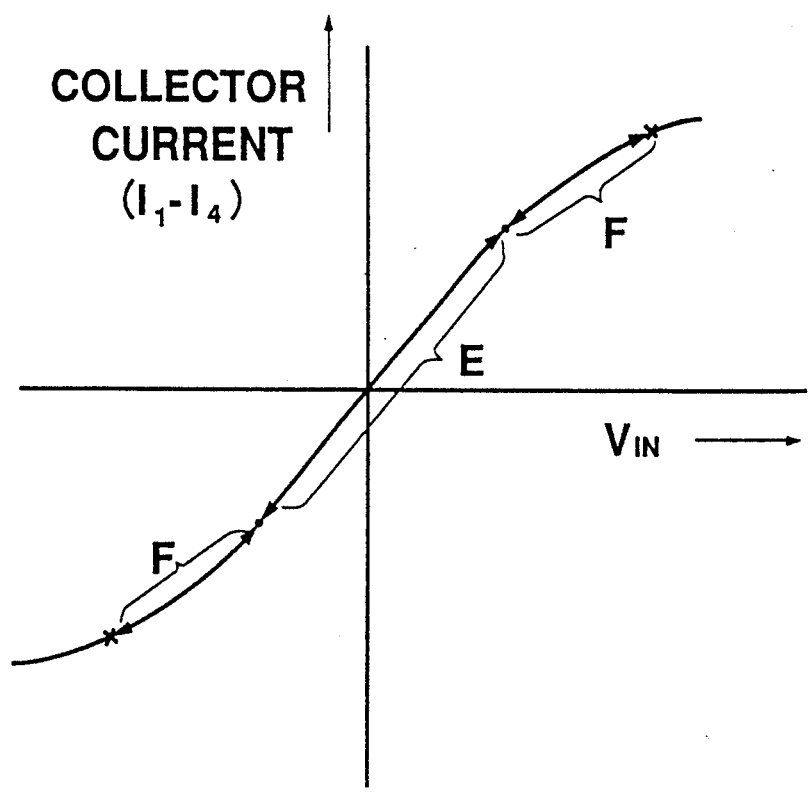
FIG. 6 is a graphic representation of a relationship between the input voltage $V_{IN}$ and output collector current $(I_1-I_4)$ of the integrator circuit 300 shown in FIG. 5A.

In FIG. 6, there is shown an input/output characteristic of the differential amplifier employed in the fourth integrator circuit 400 shown in FIG. 5A.

In this input/output characteristic curve, the mutual conductance "gm" is large within a range "E" in which the input voltage $V_{IN}$ is also small, whereas the mutual conductance "gm" becomes small within a range "F" in which the input voltage $V_{IN}$ is large. According to the preferred embodiment, the large collector current currents $I_1$ and $I_4$ flow within the range "F" so as to increase the mutual conductance "gm". As a result, the overall operation range with the better linearity can be extended, i.e. wide linearity range.

In accordance with the differential amplifier circuit shown in FIG. 5A, the operation range with the better linearity thereof becomes approximately 20 times higher than that of the conventional basic differential amplifier circuit. That is, the fourth differential amplifier circuit has the following advantages. This amplifier circuit is arranged by a single stage arrangement, and can have the better linearity over the wide operation range and the higher transconductance "Gm".

Circuit Arrangement of Fifth Integrator

Figure 5B:
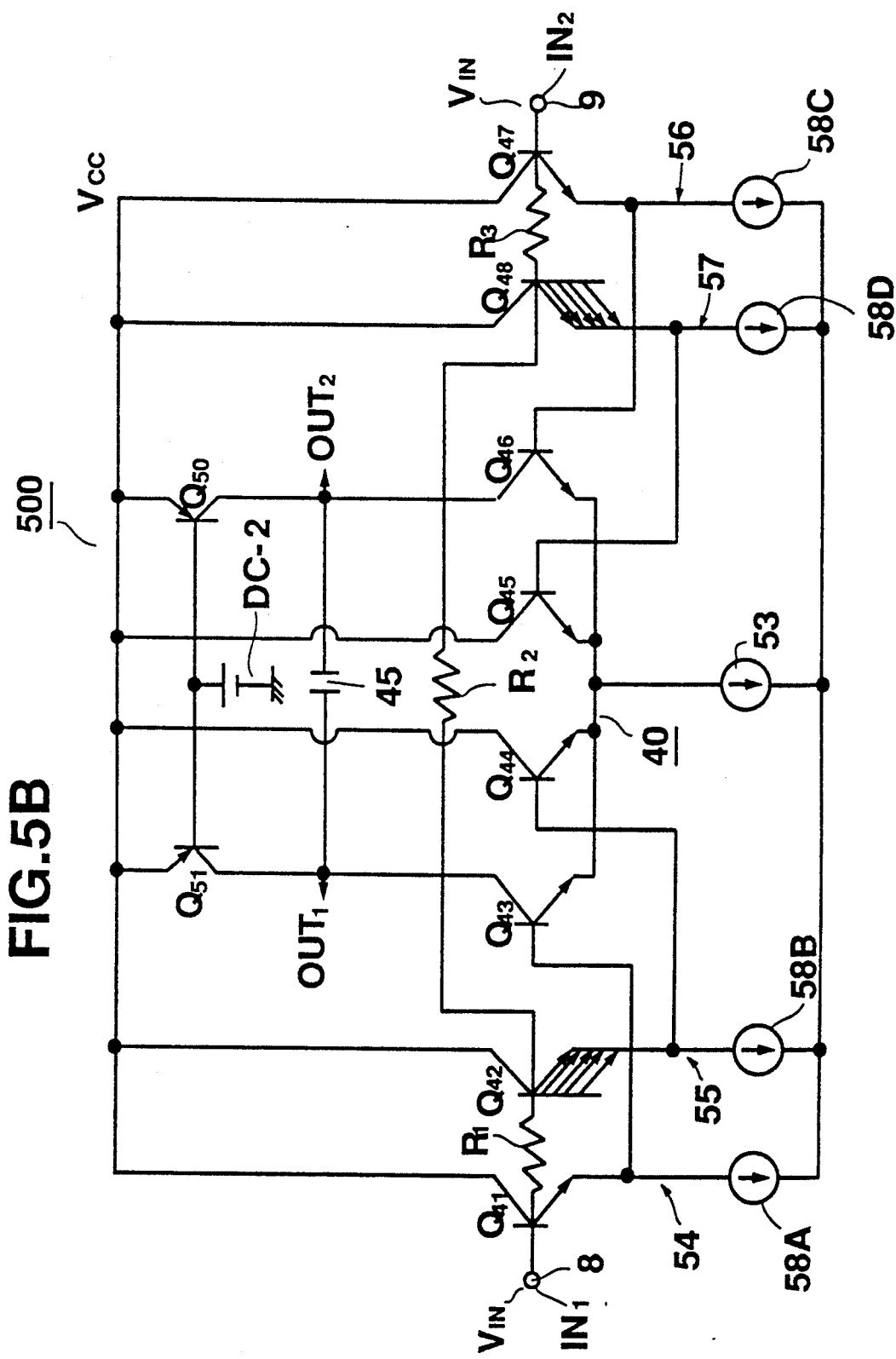

Referring now to FIG. 5B, an integrator circuit 500 according to a fifth preferred embodiment of the invention will be described.

As is apparent from the circuit shown in FIG. 5B, since the major circuit of the fifth integrator circuit 500 is the same as that of the fourth integrator circuit 400, only different circuits will be described.

That is, the fifth integrator circuit 500 shown in FIG. 5B is so arranged that the collector current sources 43 and 44 in the fourth integrator circuit 400 represented in FIG. 5A are constructed of PNP transistors $Q_{50}$ and $Q_{51}$, and also a bias power source DC-2.

The features of this integrator circuit 5 are such that the wide operating range with having the better linearity can be realized and the temperature dependent characteristic on the transconductance Gm can be cancelled.

Circuit Arrangement of Sixth Integrator

Figure 5C:
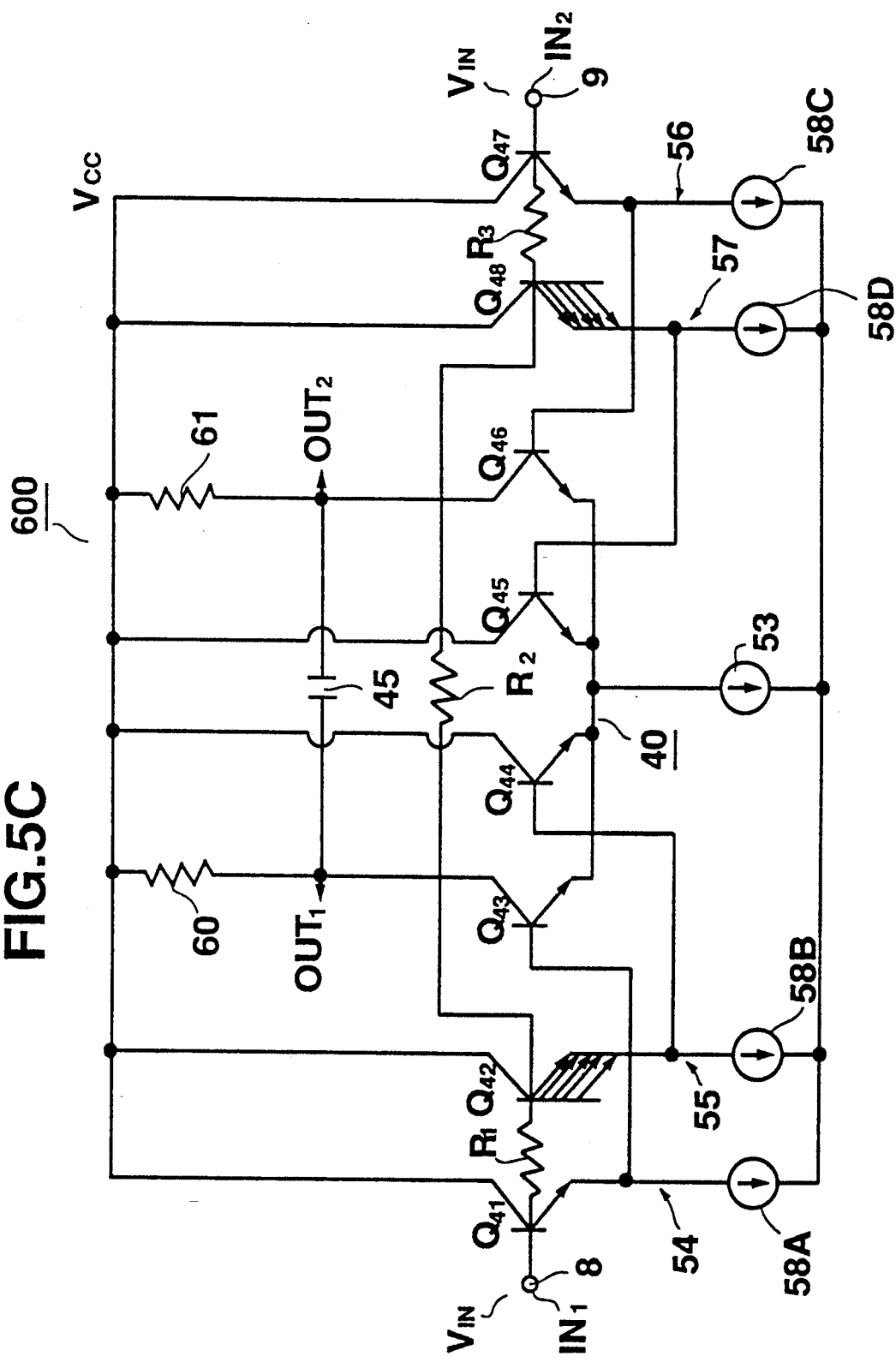

In FIG. 5C, there is shown an integrator circuit 600 according to a sixth preferred embodiment of the invention. It should be noted that the same reference numerals of FIG. 5A indicate the same or similar circuit elements shown in FIG. 5C, and therefore no further explanation thereof is made.

Simply speaking, the sixth integrator circuit 600 shown in FIG. 5C is so constructed that the collector power sources 43 and 44 of the fourth integrator circuit 400 are arranged by employing registers 60 and 61 in order to improve the frequency characteristics thereof.

Consequently, features of the sixth integrator circuit 600 are as follows. That is, a delay in a phase of a second pole is cancelled by setting a DC gain to a finite value, i.e., a phase lead so that a shift in the frequency at which the gain becomes 0 dB can be corrected.

Now, it is assumed, as one example, that a bandpass filter having a central frequency of "fo" and a quality factor "Q" of 20 is constructed. It should be noted that a bandpass filter utilizing the sixth integrator circuit 600 will be discussed later.

If the shift in the pass-band characteristic of this bandpass filter is limited within +2 dB as compared with the ideal bandpass filter having no second pole, the frequency of the second pole in the integrator circuit must be selected to be 200 times higher than the central frequency "fo" thereof. This implies that this non-ideal bandpass filter must satisfy very severe conditions.

However, even if the frequency of the second pole is set to be, for instance, 50 times higher than the central frequency "fo" of a bandpass filter, there is a solution for setting the pass-band characteristic thereof within +1 dB. This solution is such that since a DC gain is selected to be 50, a shift in a frequency at which the gain becomes 0 dB can be completely corrected. It should be noted that since a frequency of a second pole of an integrator circuit is determined by an inherent characteristic of transistor elements employed in this integrator circuit, the DC gain must be set to cancel such a frequency shift.

It should be understood that since the DC gain is inherently determined by the Early voltages of the bipolar transistors $Q_{50}$ and $Q_{51}$ in the fifth integrator circuit 500 in which the collector current sources are arranged by employing the PNP bipolar transistors $Q_{50}$ and $Q_{51}$, the DC gain cannot be freely adjusted depending upon the frequency of the second pole. However, in the sixth integrator circuit 600 shown in FIG. 5C, since resistance values of the resistors 60 and 61 in the collector circuits of emitter-coupled transistor pair 40 can be freely designed by the manufacturing process of the IC chip, the above-described solution can be realized. In particular, in case that a conventional filter having a higher Q (quality factor) is constructed of employing an integrator circuit, such a 2nd pole shift compensation according to the invention becomes significantly important because the quality factor control thereof is rather difficult in the conventional filter circuit.

Circuit Arrangement of First Bandpass Filter

To achieve the above-explained secondary object of the invention, a description will now be made to an active filter.

Figure 7:
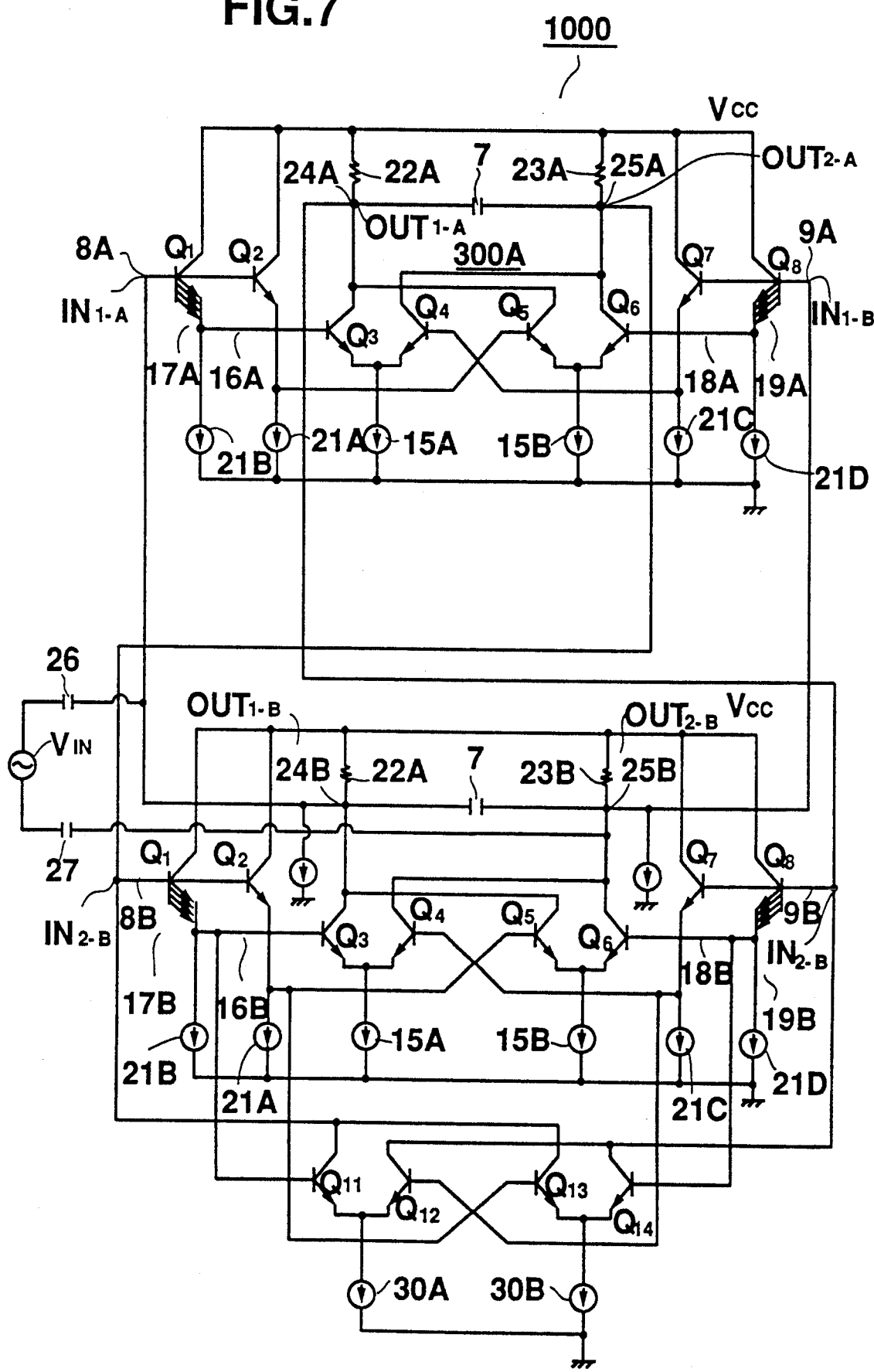
FIG. 7 is a circuit diagram of a bandpass filter 1000 according to a first preferred embodiment of the invention, in which two sets of the third integrator circuit 300 are employed so as to achieve a secondary object of the invention.

In FIG. 7, there is shown a bandpass filter 1000 according to a first preferred embodiment of the invention. This bandpass filter 1000 is mainly constructed of two sets of the above-described third integrator circuit 300 illustrated in FIG. 4C so as to arrange a quadratic bandpass filter.

A circuit arrangement of the quadratic bandpass filter 1000 shown in FIG. 7 will now be described.

It should be noted that the same reference numerals employed in FIG. 4C denote those for indicating the same or similar circuit elements in the following figure.

Two sets of integrator circuits 300A and 300B are employed which correspond to the third integrator circuit 300. A first output terminal 24A (OUT1-A) of one integrator circuit 300A is connected to a first input terminal 9B (IN1-A) of the other integrator circuit 300B, whereas a second output terminal 25A (OUT2-A) of one integrator circuit 300A is connected to a second input terminal 8B (IN2-B) of the other integrator circuit 300B. Also both the first and second output terminals 24B (OUT1-B) and 25A (OUT1-A) are connected to the corresponding input terminals 8A (IN1-A) and 9A (IN1-B) of one integrator circuit 300A. Accordingly, two sets of integrator circuits 300A and 300B are connected to each other via emitter followers provided at the respective input stage and output stage.

The input signal $V_{IN}$ is inputted to this quadratic bandpass filter 1000 by employing capacitors 26 and 27 as a capacitive division. Bipolar transistors $Q_{11}$, $Q_{12}$, $Q_{13}$ and $Q_{14}$ are employed so as to constitute termination registers, and are grounded via constant current sources 30A and 30B.

In accordance with the quadratic bandpass filter 1000, the frequency "fc" of the second pole of the integrator circuit is determined by a time constant defined by the following items. That is, the time constant is defined by a summation between output impedances of the emitter followers 16A, 16B, 17A, 17B, 18A, 18B, 19A and 19B for coupling these integrator circuits 300A and 300B, and base resistance values of the transistors connected to these emitter followers, and also base-emitter capacitances thereof. Thus, the entire frequency characteristics of the integrator circuits can be determined based upon the time constant as well as the frequency "fc" of the second pole. In general, since inherent frequency characteristics of differential amplifier circuits constituting a bandpass filter are substantially determined by a manufacturing process of transistors constituting this filter, it is difficult to vary the frequency characteristics. However, according to the bandpass filter 1000, since the above-described time constant can be changed by varying the current values of the emitter followers 16A to 19B, the frequency characteristics thereof can be easily controlled. As a consequence, the cancellation effect between the second pole and DC gain can be controlled by controlling the current values of the emitter followers 16A to 19B without varying the overall transconductance Gm of the differential circuits constituting the quadratic bandpass filter 1000. As previously described, any types of Q-controlling means are necessarily required in a filter having a higher Q (quality factor). However, according to the above-described feature of the preferred embodiment, such a Q-controlling means can be readily realized without additionally employing a specific Q-controlling circuit by simply utilizing the above-described current control of the emitter followers.

In accordance with the specific features of the preferred embodiment, the cancellation effect between the DC gain and second pole is firstly performed to some extent by setting resistance values 22I, 22B, 23A, 23B connected to the respective differential amplifier circuits as a load, and furthermore, the cancellation effect is finally achieved by controlling the respective constant current sources 21A to 21D so as to adjust currents of the emitter followers 16A to 19B. Thus, the desirable frequency characteristics can be obtained.

Figure 1:
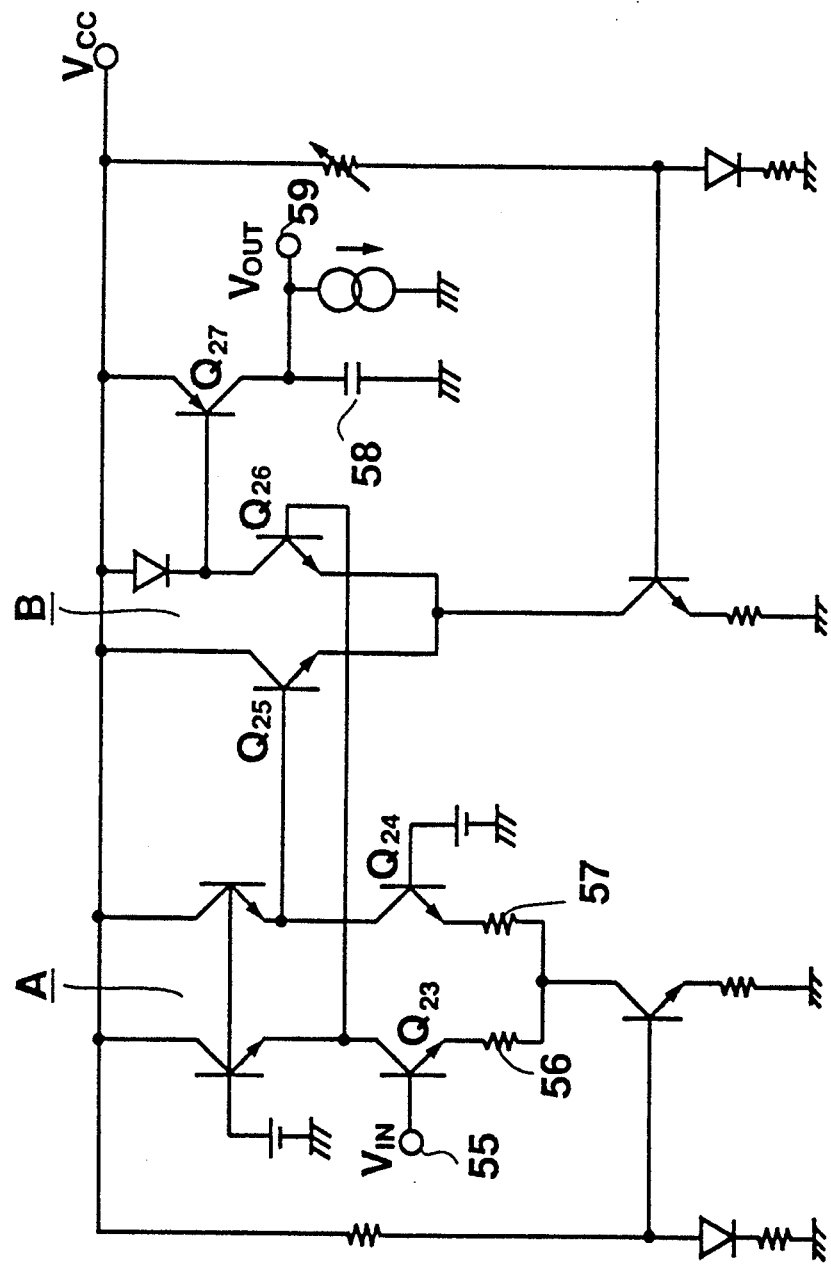
FIGS. 1 to 3 are circuit diagrams of a prior art integrator circuit and equivalent circuits thereof.
Figure 2:
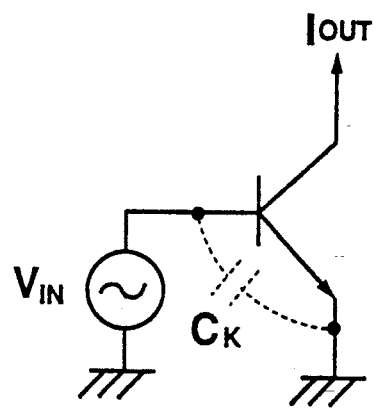
Figure 3:
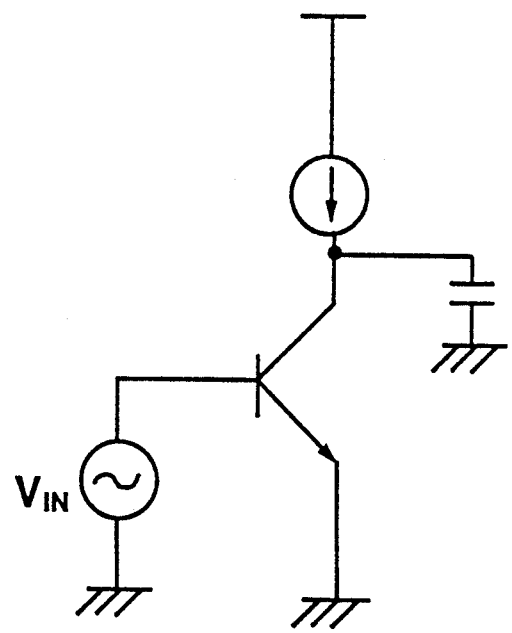

It should be noted that although the signal transmission/reception is carried out between two conventional integrator circuits shown in FIG. 1, the time constant thereof cannot be changed even if the currents of the emitter followers are varied because the resistors 56 and 57 are connected to the emitter circuits of the differential amplifier circuits functioning as the load for the emitter followers. To the contrary, the overall frequency characteristics can be readily controlled by merely changing the currents of the emitter followers 16 to 19B in the quadratic bandpass filter 1000 shown in FIG. 7. Furthermore, in accordance with the quadratic bandpass filter 1000, the quality factor thereof can be readily controlled without employing any specific Q-control circuit, which is one of the major features of the present invention, as compared with the conventional integrator circuit shown in FIG. 1.

Circuit Arrangement of Second Bandpass Filter

To also achieve the above-explained secondary object of the invention, a description will now be made to another active filter.

Figure 8:
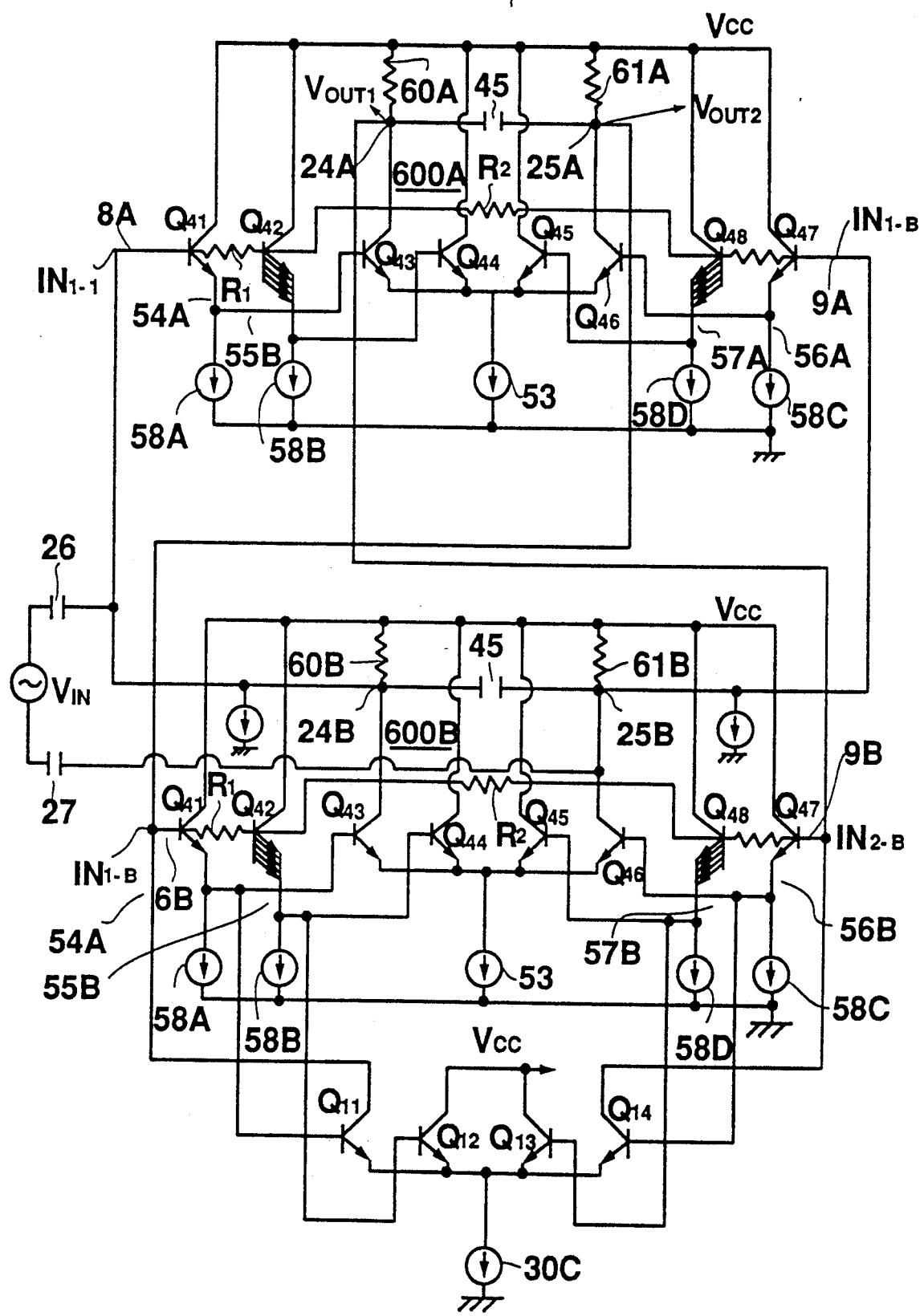
FIG. 8 is a circuit diagram of a bandpass filter 2000 according to a second preferred embodiment of the invention, in which two sets of the six integrator circuit 600 are employed in order to achieve the secondary object of the invention.

In FIG. 8, there is shown another bandpass filter 2000 according to a second preferred embodiment. This bandpass filter 2000 is mainly constructed of two sets of the above-described sixth integrator circuit 600 illustrated in FIG. 5C so as to arrange a quadratic bandpass filter.

A circuit arrangement of the second quadratic bandpass filter 2000 shown in FIG. 8 will now be described.

It should be noted that the same reference numerals employed in FIG. 5C denote those for indicating the same or similar circuit elements in the following figures.

Two sets of integrator circuits 600A and 600B are employed which correspond to the sixth integrator circuit 600. A first output terminal 24A (OUT1-A) of one integrator circuit 600A is connected to a first input terminal 9B (IN2-B1) of the other integrator circuit 600B, whereas a second output terminal 25A (OUT2-A) of one integrator circuit 600A is connected to a second input terminal 8B (IN2-B) of the other integrator circuit 600B. Also both the first and second output terminals 24B (OUT1-B) and 25A (OUT1-A) are connected to the corresponding input terminals 8A (IN1-A) and 9A (IN1-B) of one integrator circuit 600A. Accordingly, two sets of integrator circuits 600A and 600B are connected to each other via emitter followers 54A, 54B, 55A, 55B, 56A, 56B, 57A and 57B provided at the respective input stage and output stage.

The input signal $V_{IN}$ is inputted to this quadratic bandpass filter 2000 by employing capacitors 26 and 27 as a capacitive division. Bipolar transistors $Q_{11}$, $Q_{12}$, $Q_{13}$ and $Q_{14}$ are employed so as to constitute termination registers, and are grounded via a constant current source 30C.

In accordance with the quadratic bandpass filter 2000, the frequency "fc" of the second pole of the integrator circuit is determined by a time constant defined by the following items. That is, the time constant is defined by a summation between output impedances of the emitter followers 54A through 57B for coupling these integrator circuits 600A and 600B, and base resistance values of the transistors connected to these emitter followers, and also base-emitter capacitances thereof. Thus, the entire frequency characteristics of the integrator circuits can be determined based upon the time constant as well as the frequency "fc" of the second pole. In general, as previously described, since inherent frequency characteristics of differential amplifier circuits constituting a bandpass filter are substantially determined by a manufacturing process of transistors constituting this filter, it is difficult to vary the frequency characteristics. However, according to the bandpass filter 1000, since the above-described time constant can be changed by varying the current values of the emitter followers 54A to 57B, the frequency characteristics thereof can be easily controlled. As a consequence, the cancellation effect between the second pole and DC gain can be controlled by controlling the current values of the emitter followers 54A to 57B without varying the overall transconductance Gm of the differential circuits constituting the second quadratic bandpass filter 2000. As previously described, any types of Q-controlling means are necessarily required in a conventional filter having a higher Q (quality factor). However, according to the above-described feature of the preferred embodiment, such a Q-controlling means can be readily realized without additionally employing a specific Q-controlling circuit by simply utilizing the above-described current control of the emitter followers.

In accordance with the specific features of the preferred embodiment, the cancellation effect between the DC gain and second pole is firstly performed to some extent by setting resistance values 60A, 60B, 61A, 61B connected to the respective differential amplifier circuits as a load, and furthermore, the cancellation effect is finally achieved by controlling the respective constant current sources 58A to 58D so as to adjust currents of the emitter followers 54A to 57B. Thus, the desirable frequency characteristics can be obtained.

It should be noted that although the signal transmission/reception is carried out between two conventional integrator circuits shown in FIG. 1, the time constant thereof cannot be changed even if the currents of the emitter followers are varied because the resistors 56 and 57 are connected to the emitter circuits of the differential amplifier circuits functioning as the load for the emitter followers. To the contrary, the overall frequency characteristics can be readily controlled by merely changing the currents of the emitter followers 43A to 57B in the second quadratic bandpass filter 2000 shown in FIG. 8. Furthermore, in accordance with the quadratic bandpass filter 2000, the quality factor thereof can be readily controlled without employing any specific Q-control circuit, which is one of the major features of the present invention, as compared with the conventional integrator circuit shown in FIG. 1.

Modifications of Integrators

As is apparent from the foregoing descriptions, the present invention is not limited to the above-described preferred embodiments, but may be modified, changed and substituted without departing from the technical spirit and scope of the present invention.

Figure 9A:
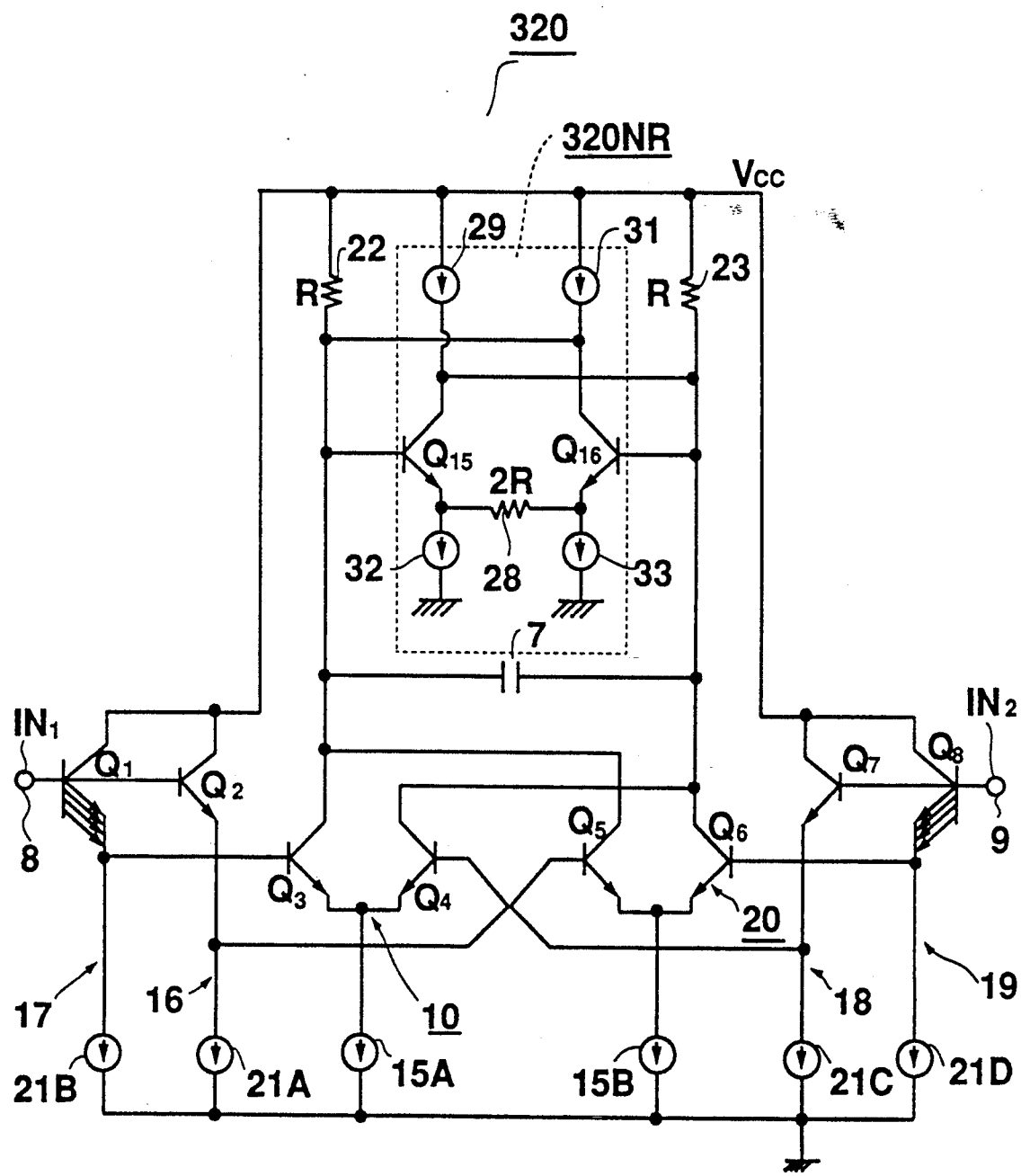
FIGS. 9A, 9B and 9C are circuit diagrams of integrator circuits 320, 340 and 360 according to variations of the first and third integrator circuits 100 and 300 shown in FIGS. 4A and 4C.

First, FIG. 9A is a circuit diagram of an integrator circuit 320 according to a first modification belonging to the third integrator circuit 300 shown in FIG. 4C.

A feature of this modified integrator circuit 320 is that a negative resistance circuit 320NR is connected, parallel to the resistors 22 and 23 of the third integrator circuit 300, and thus, DC voltage drops across these resistors 22 and 23 enable this integrator circuit 320 manufactured as an integrated circuit (IC) to be operated under the low supply voltage.

The negative resistor circuit 320NR, according to the feature of the preferred embodiment, is constructed of such a positive-feedback circuit that two bases of NPN transistors $Q_{15}$ and $Q_{16}$ of a differential amplifier circuit which is emitter-degenerated by a terminal resistor 28 having a resistance value of 2R (assuming that each resistance value of the collector resistors 22 and 23 is equal to "R"), are mutually connected to collectors of the corresponding transistors $Q_{15}$ and $Q_{16}$.

A synthetic, or combined resistance value between the collector resistors 22, 23 and the negative resistance circuit 320NR is expressed by the following equation (11) if the mutual conductance of these transistors $Q_{15}$ and $Q_{16}$ is equal to "gm";

$$[-(1/gm + R) \cdot R]/[-(1/gm + R) + R] = \quad (11)$$

$$[R/(1/gm)] \cdot [(1/gm) + R] = R \cdot (1 + gm \cdot R)$$

Then, the synthetic resistance value is equal to a value multiplied by (1+gm.R). As a consequence, even if the DC voltage applied to the resistors 22 and 23 is set to be low, the equivalent load resistance of the differential amplifier circuit including the transistors $Q_{15}$ and $Q_{16}$ can be set to be large, so that the higher DC gain can be achieved.

Figure 9B:
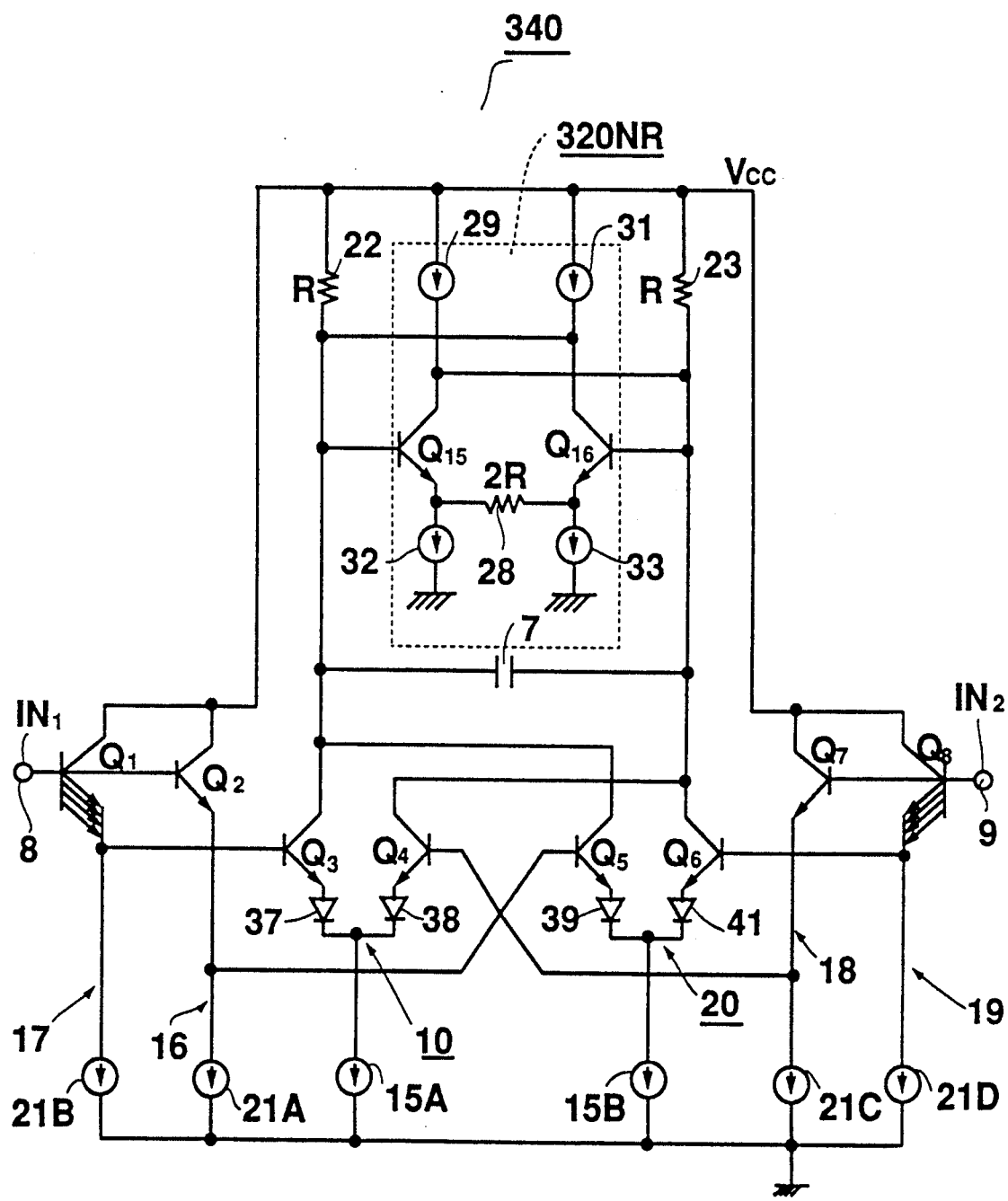

FIG. 9B represents an integrator circuit 340 according to a second modification belonging to the third integrator circuit 300. A feature of this integrator circuit 340 is such that in addition to the integrator circuit 320 shown in FIG. 9A, diodes 37, 38, 39 and 41 are series-connected to the emitter circuits of the transistors $Q_3$, $Q_4$, $Q_5$ and $Q_6$ of the first and second emitter-coupled transistor pairs 10A and 20B. As a result, a range of an input signal level with maintaining the linearity of this integrator circuit 340 can be expanded about two times, as compared with that of the previous integrator circuit 320.

Although only one diode 37, 38, 39 or 41 is series-connected to the corresponding emitter circuits of the transistors $Q_3$, $Q_4$, $Q_5$ and $Q_6$, two or more diodes may be connected in series to the respective emitter circuits in order to further expand the range of the input signal level with keeping the linearity. It should be noted that since a forward voltage drop of approximately 0.7V appears across a single diode, the number of the series-connected diodes must be determined, taking account of the desired low voltage operation of the integrator circuit 340.

Figure 9C:
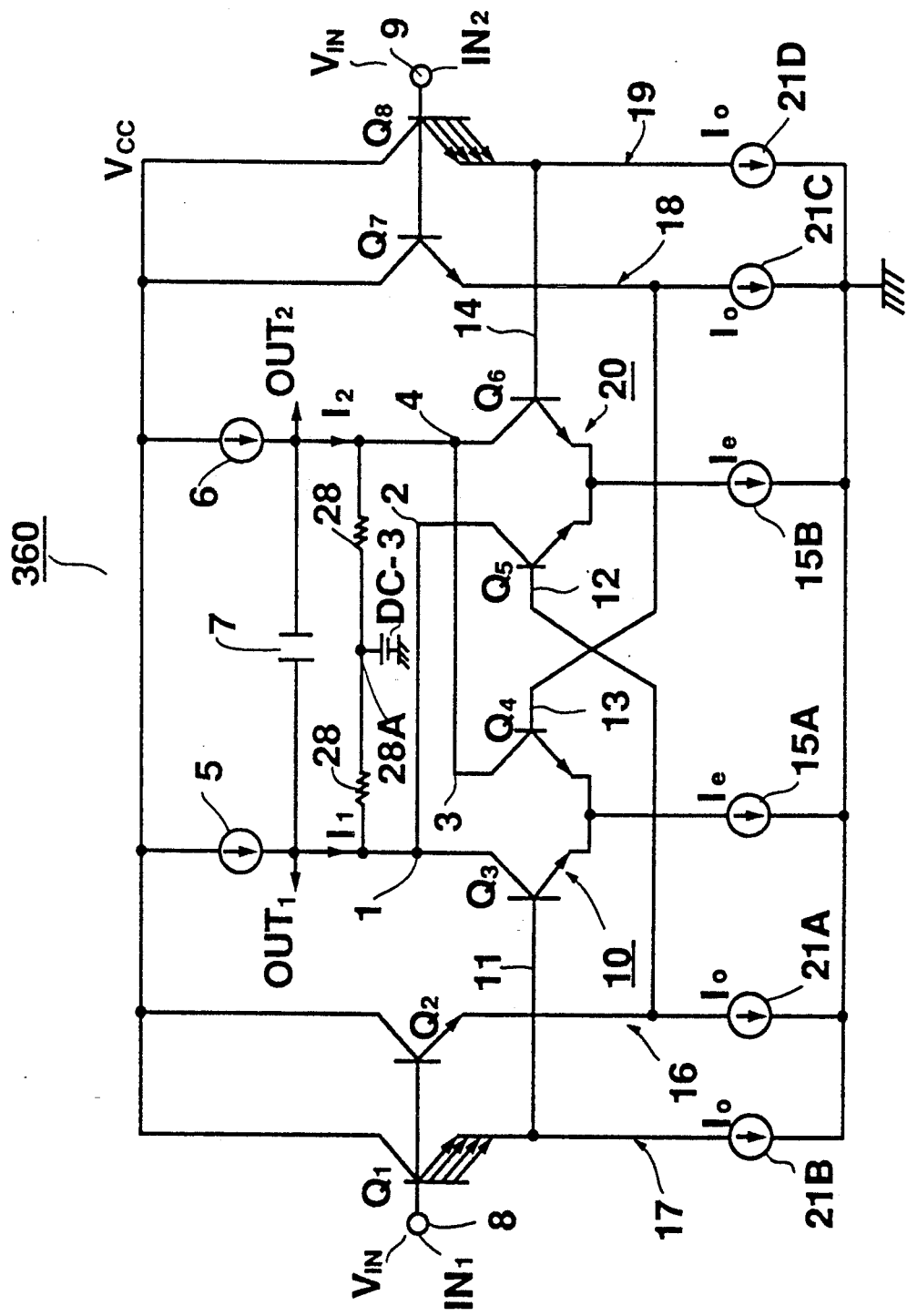

A further integrator circuit 360 shown in FIG. 9C corresponds to a modified integrator circuit in which a resistor 28 for compensating the phase characteristic thereof is connected parallel to the capacitor 7 employed in the first integrator circuit 100 shown in FIG. 4A. A dividing point, or central point 28A of this resistor 28 is formed so as to equally divide the resistance value of this resistor 28. Between this resistance dividing point and the ground line, a DC bias voltage source DC-3 is connected not to produce a DC voltage drop between the load (i.e., the collector current sources 5 and 6 shown in FIG. 9C) from which the differential outputs of the differential amplifier circuits are obtained. Since the resistor 28 and bias voltage source DC-3 are newly employed in this integrator circuit 360, the DC potential at the load can be stabilized and this integrated circuit 360 is constructed by all differential amplifier arrangement. As a result, the phase compensation can be further achieved and the frequency characteristic can also be improved.

Figure 10A:
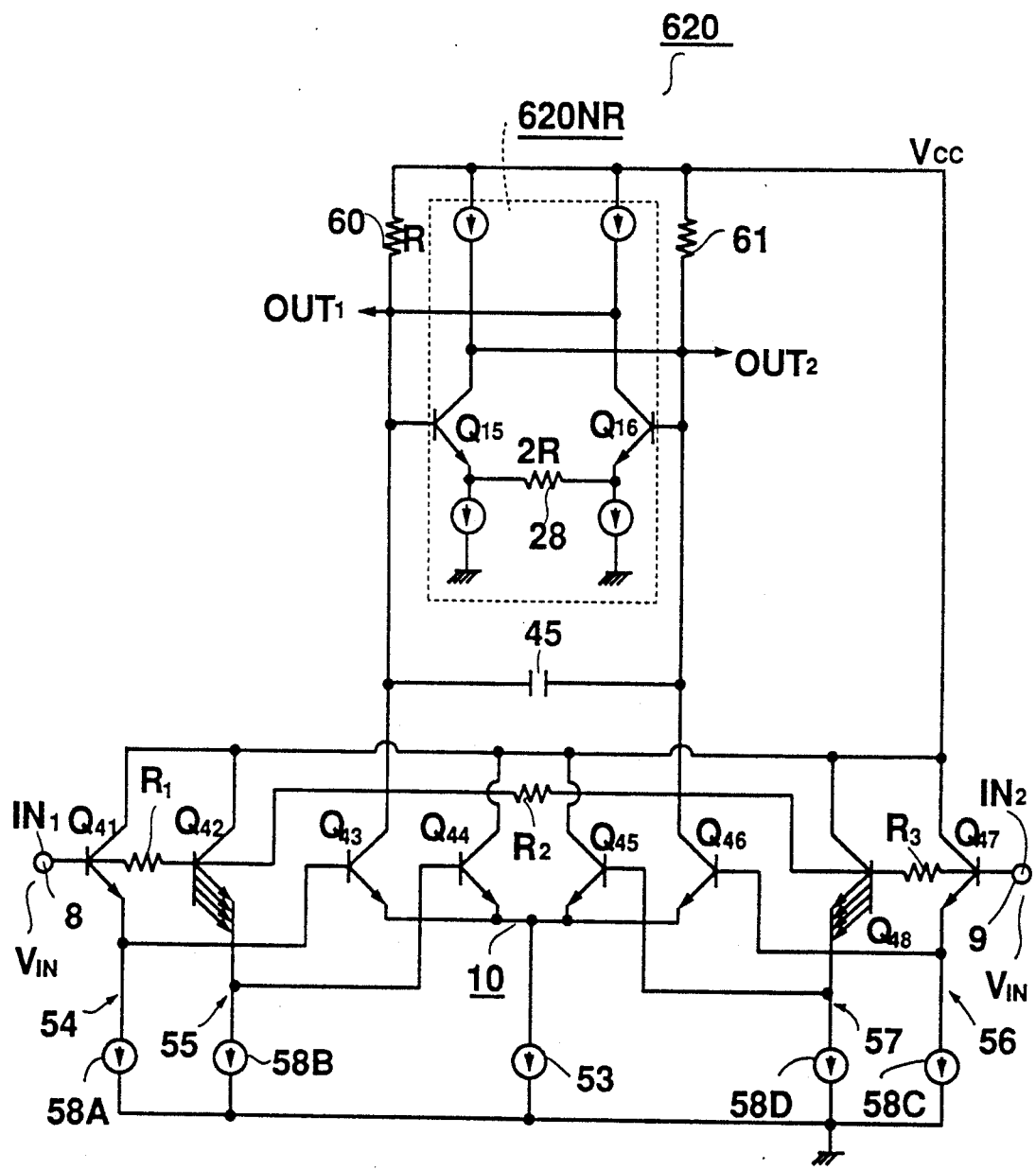
FIGS. 10A through 10E are circuit diagrams of integrator circuits 620 to 680 and 420 according to variations of the sixth integrator circuit 600 shown in FIG. 5C and a variation of the fourth integrator circuit 400 shown in FIG. 5A.

Furthermore, FIG. 10A is a circuit diagram of an integrator circuit 620 according to a first modification belonging to the sixth integrator circuit 600 shown in FIG. 5C, which corresponds to the modified integrator circuit 320 shown in FIG. 9A.

A feature of this modified integrator circuit 620 is that a negative resistance circuit 620NR is connected, parallel to the resistors 60 and 61 of the third integrator circuit 300, and thus, DC voltage drops across these resistors 60 and 61 enable this integrator circuit 620 manufactured as an integrated circuit (IC) to be operated under the low supply voltage.

The negative resistor circuit 620NR, according to the feature of the preferred embodiment, is constructed of such a positive-feedback circuit that two bases of NPN transistors $Q_{15}$ and $Q_{16}$ of a differential amplifier circuit which is emitter-degenerated by a terminal resistor 28 having a resistance value of 2R (assuming that each resistance value of the collector resistors 22 and 23 is equal to "R"), are mutually connected to collectors of the corresponding transistors $Q_{15}$ and $Q_{16}$.

A synthetic, or combined resistance value between the collector resistors 60, 61 and the negative resistance circuit 620NR is expressed by the previous equation (11) if the mutual conductance of these transistors $Q_{15}$ and $Q_{16}$ is equal to "gm".

Figure 10B:
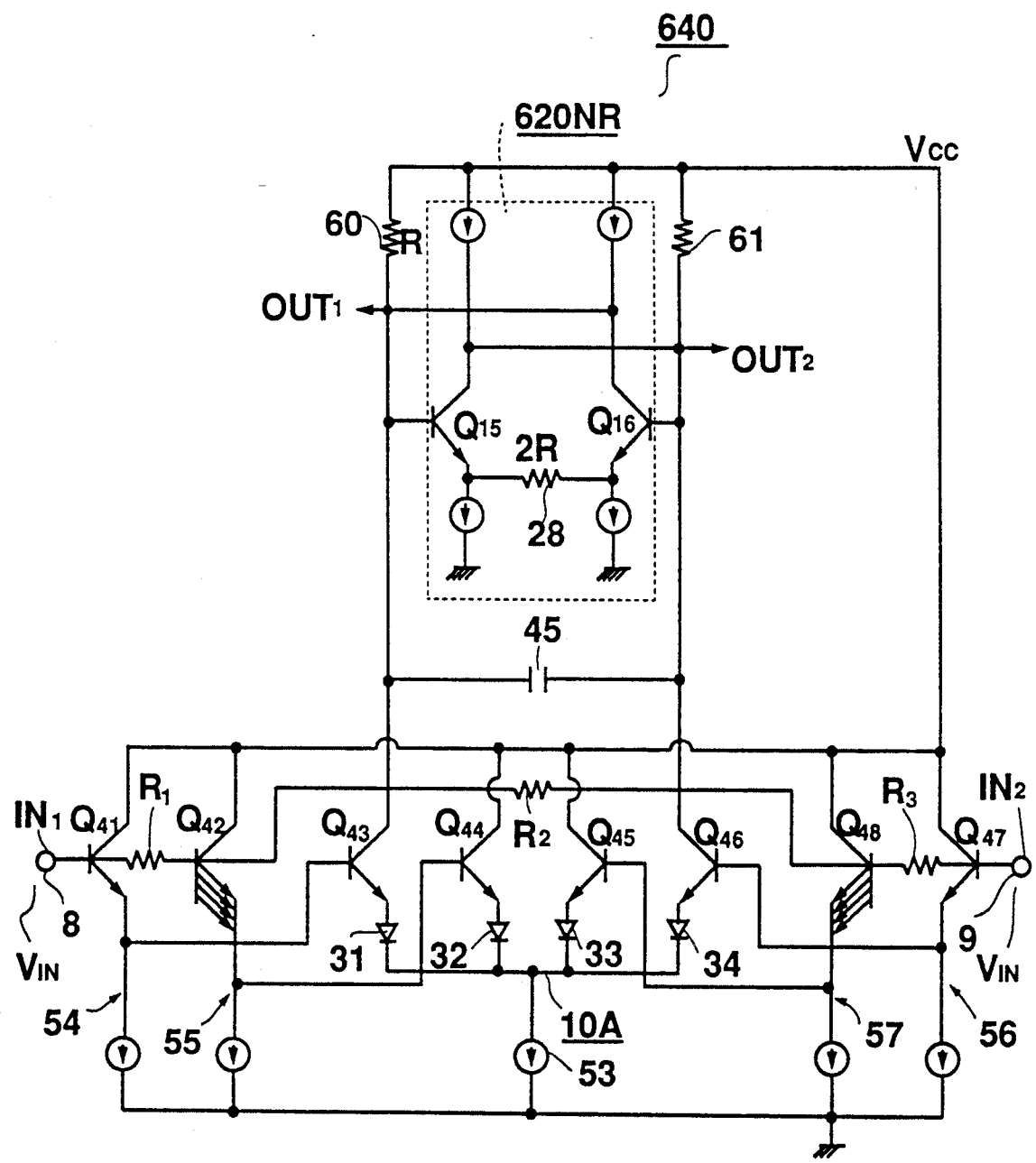

FIG. 10B represents an integrator circuit 640 according to a second modification belonging to the sixth integrator circuit 600. A feature of this integrator circuit 640 is such that in addition to the integrator circuit 620 shown in FIG. 10A, diodes 31, 33, 34 and 41 are series-connected to the emitter circuits of the transistors $Q_{43}$, $Q_{44}$, $Q_{45}$ and $Q_{46}$ of the emitter-coupled transistor pair 10A. As a result, a range of an input signal level with maintaining the linearity of this integration circuit 640 can be expanded about two times, as compared with that of the previous integrator circuit 620.

Although only one diode 31, 32, 33 or 34 is series-connected to the corresponding emitter circuits of the transistors $Q_{43}$, $Q_{44}$, $Q_{45}$ and $Q_{46}$, one or more diodes may be connected in series to the respective emitter circuits in order to further expand the range of the input signal level with keeping the better linearity. It should be noted that since a forward voltage drop of approximately 0.7V appears across a single diode, the number of the series-connected diodes must be determined, taking account of the desired low voltage operation of the integrator circuit 640.

Figure 10C:
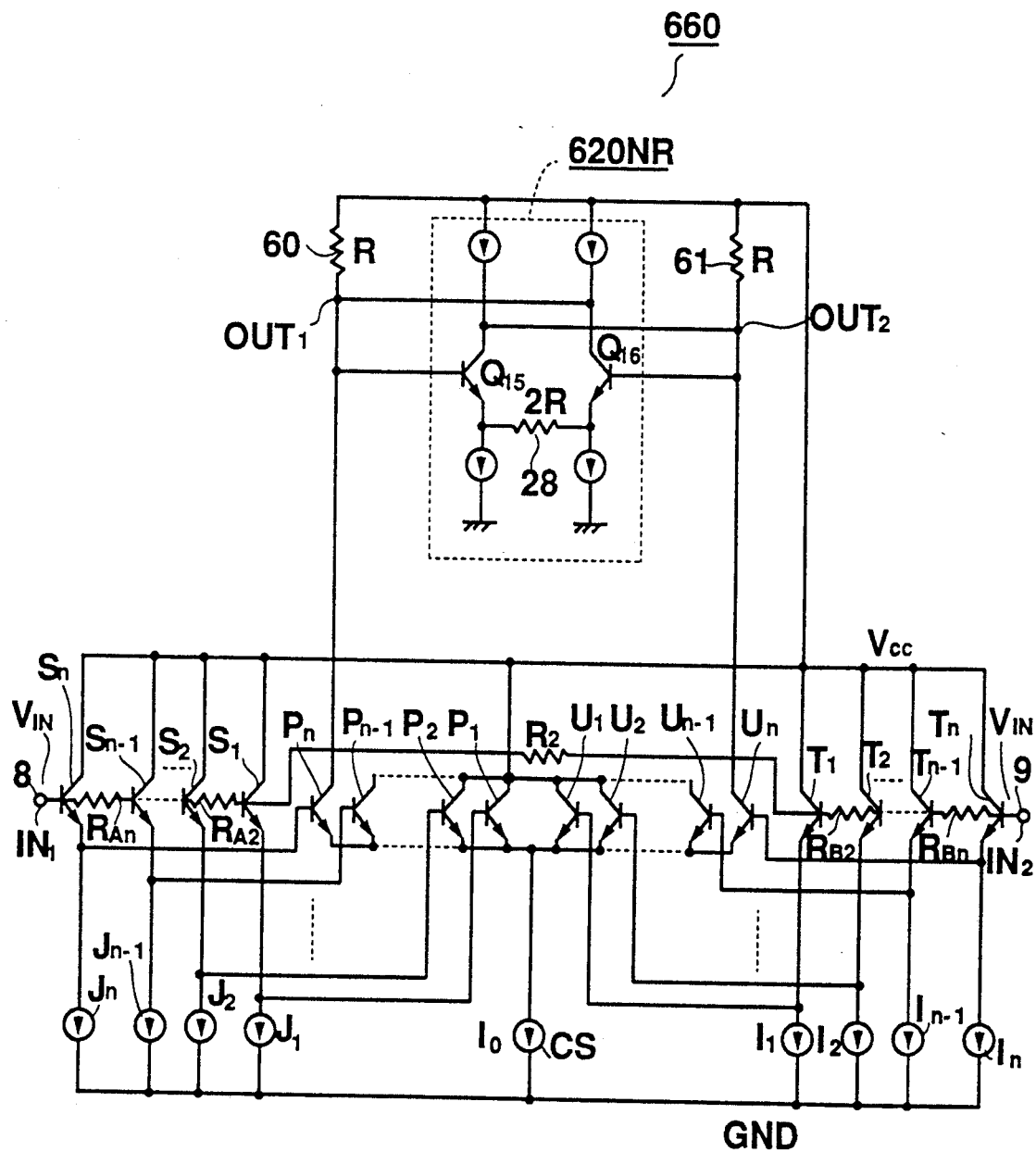

As apparent from the circuit diagram of this integrator circuit 640, this circuit 640 corresponds to the modified integrator circuit 340 shown in FIG. 9B. In FIG. 10C, there is shown another integrator circuit 660 which is constructed by modifying in a generic form the modified integrator circuit 620 shown in FIG. 10A.

In the integrator circuit 660, emitters of 2n pieces ("n" being an integer) of transistors having the substantial equal emitter areas with each other, for constituting n sets of emitter-coupled transistor pairs $P_1$, $U_1$, $P_2$, $U_2$, - - -, $P_n$ and $U_n$ is connected to a common current source CS. Collectors of the outermost transistors $P_n$ and $U_n$ are connected to first and second output terminals $OUT_1$ and $OUT_2$, and collectors of other transistors $P_1$, $U_1$, $P_2$, $U_2$, - - -, $P_{n-1}$ and $U_{n-1}$ are connected to the power supply terminal $V_{cc}$.

A drive means for these transistor pairs is constructed of transistors $S_1$, $S_2$, - - -, $S_n$, $T_1$, $T_2$, ---, $T_n$ and $S_n$ pieces ("n" being an integer) of emitter followers arranged by current sources $J_1$, $J_2$, - - -, $J_n$, $I_1$, $I_2$, ---, $I_n$ as emitter loads of these transistors. Bases of the transistors $P_1$, $P_2$, - - -, $P_n$, $U_1$, $U_2$, ---, $U_n$ for constituting the emitter-coupled transistor pairs are connected to emitters of the transistors $S_1$, $S_2$, - - -, $S_n$, $T_1$, $T_2$, ---, Tn functioning as the output terminals of the emitter follower.

In the emitter followers of this integrator circuit 660, the emitter areas of the respective transistors $S_1$, $S_2$, - - -, $S_n$, $T_1$, $T_2$, ---, $T_n$ are different from each other, otherwise the current values of the current sources $J_1$, $J_2$, - - -, $J_n$, $I_1$, $I_2$, ---, $I_n$ are different from each other. As a result, the DC voltages differ from each other which are superimposed to the AC signals supplied to each base of the emitter-coupled transistor pairs $P_1$, $U_1$, $P_2$, $U_2$, - - -, $P_n$ and $U_n$.

The base electrodes of the transistors $S_1$, $S_2$, - - -, $S_n$, $T_1$, $T_2$, - - -, $T_2$ are connected to each voltage dividing point of a first voltage diving means and a second dividing means. The first dividing means is constructed of resistors $R_2$, $RA_2$, - - -, $R_{An}$ whereas the second dividing means is arranged by resistors $R_2$, $R_{B2}$, - - -, $R_{Bn}$. One end of the first voltage dividing means is connected to a first input terminal $IN_1$ and one end of the second voltage dividing means is connected to a second input terminal $IN_2$. With this circuit arrangement, while the phases of the AC signals applied to the respective electrodes of the emitter-coupled transistor pairs $P_1$, $U_1$, $P_2$, $U_2$, - - -, $P_n$, $U_n$, are equal to each other, the amplitudes of the AC signals are different from each other in accordance with the respective resistor voltage dividing points.

Figure 10D:
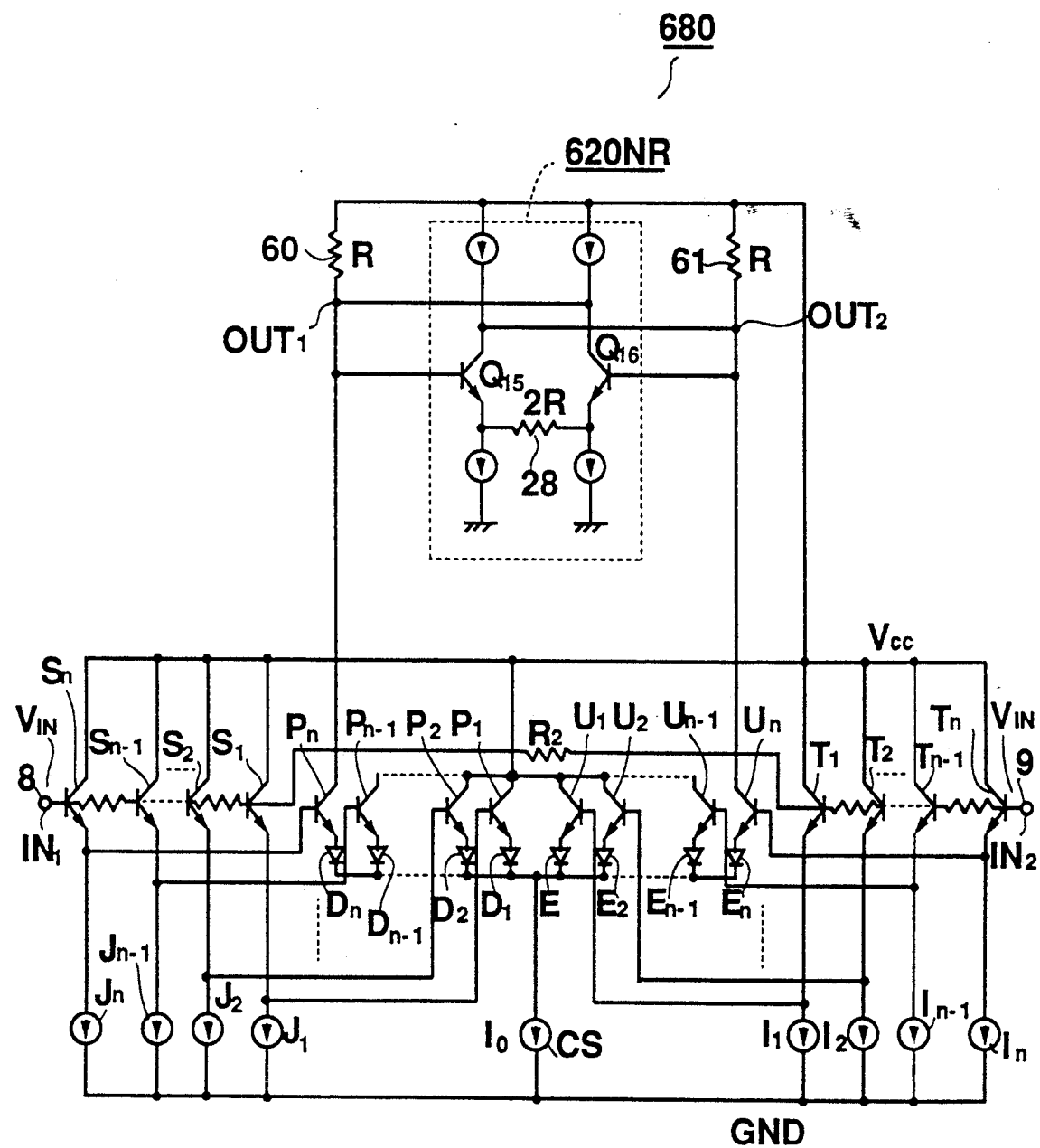

FIG. 10D represents an integrator circuit 680 as a fourth modification of the integrator circuit 620 shown in FIG. 10A. This modified integrator circuit 680 is so constructed that in addition to the previous integrator circuit 660 shown in FIG. 10C, diodes $D_1$, $D_2$, - - -, $D_n$, $E_1$, $E_2$, - - -, $E_n$ are series-connected to the emitters of the respective transistors $P_1$, $P_2$, - - -, $P_n$, $U_1$, $U_2$, - - -, $U_n$ for constituting the emitter-coupled transistor pairs. Accordingly the range of the input signal level with maintain the linearity can be expanded twice, as compared with that of the previous integrator circuit 660 shown in FIG. 10C. It is of course possible to increase the number of the series-connected diodes $D_1$, $D_2$, - - -, $D_n$, $E_1$, $E_2$, - - -, $E_n$ so as to further expand the range of the input signal level.

It should be understood that if the number of the transistors $P_1$, $P_2$, - - -, $P_n$, $U_4$, $U_2$, - - -, $U_n$ employed in these integrator circuits 660 and 680 shown in FIGS. 10C and 10D is increased, although the input signal level can be increased, the mutual conductance "gm" is lowered. However, the present invention does not utilize such a conventional technique that the input signal level is expanded by the expansion and compression, but utilizes a novel technique that only the input signal level can be expanded without changing the level of the noise signal produced from the integrator circuits, resulting in a higher signal-to-noise ratio.

Figure 10E:
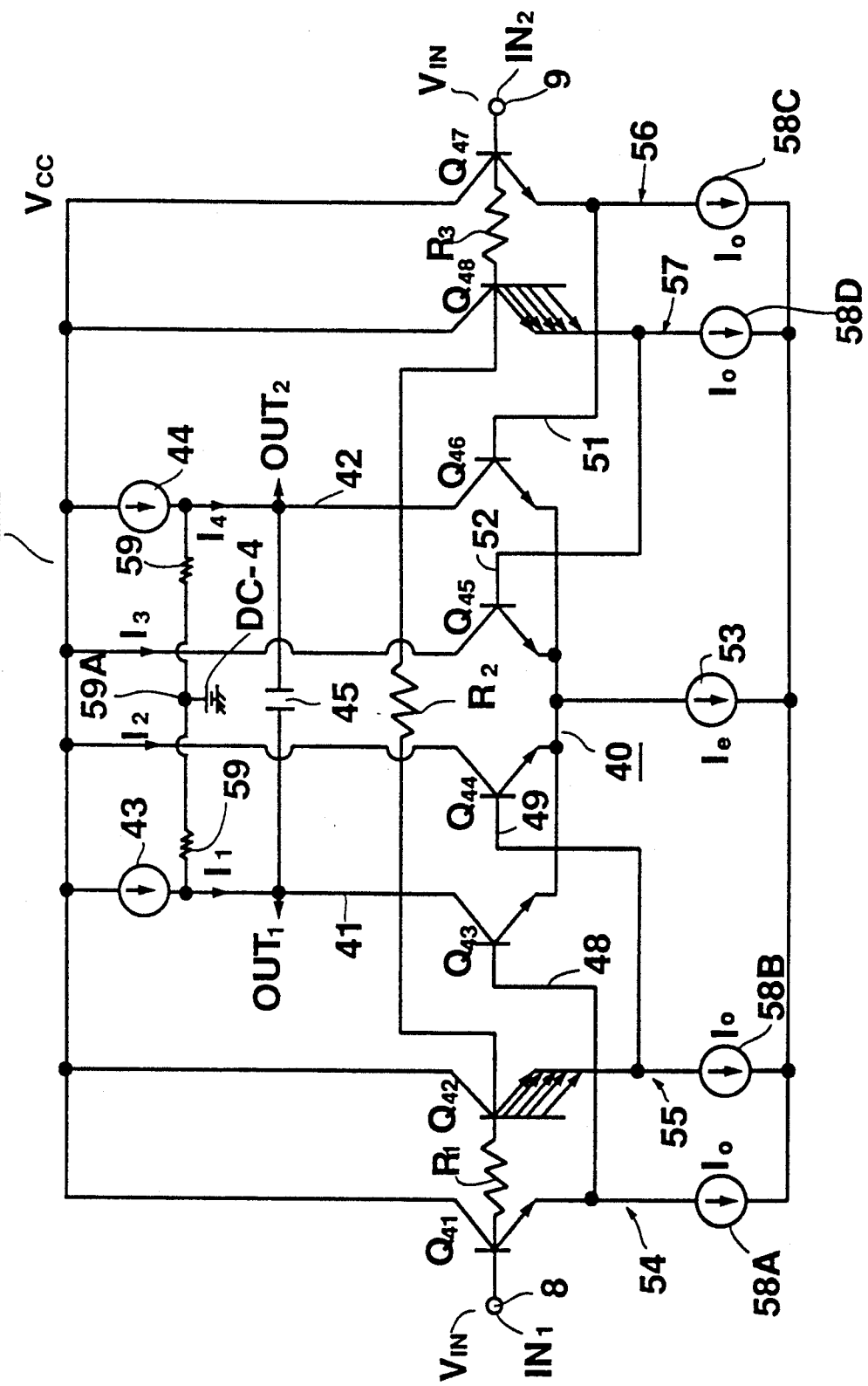

A further integrator circuit 420 shown in FIG. 10E corresponds to a modified integrator circuit in which a resistor 59 for compensating the phase characteristic thereof is connected parallel to the capacitor 45 employed in the first integrator circuit 400 shown in FIG. 5A. A dividing point, or central point 59A of this resistor 59 is formed so as to equally divide the resistance value of this resistor 59. Between this resistance dividing point and the ground line, a DC bias voltage source DC-4 is connected not to produce a DC voltage drop between the load (i.e., the collector current sources 43 and 44 shown in FIG. 5A) from which the differential outputs of the differential amplifier circuits are obtained. Since the resistor 59 and bias voltage source DC-4 are newly employed in this integrator circuit 420, the DC potential at the load can be stabilized and this integrated circuit 420 is constructed by all differential amplifier arrangement. As a result, the phase compensation can be further achieved and the frequency characteristic can also be improved.

Modification of Bandpass Filter

Figure 11:
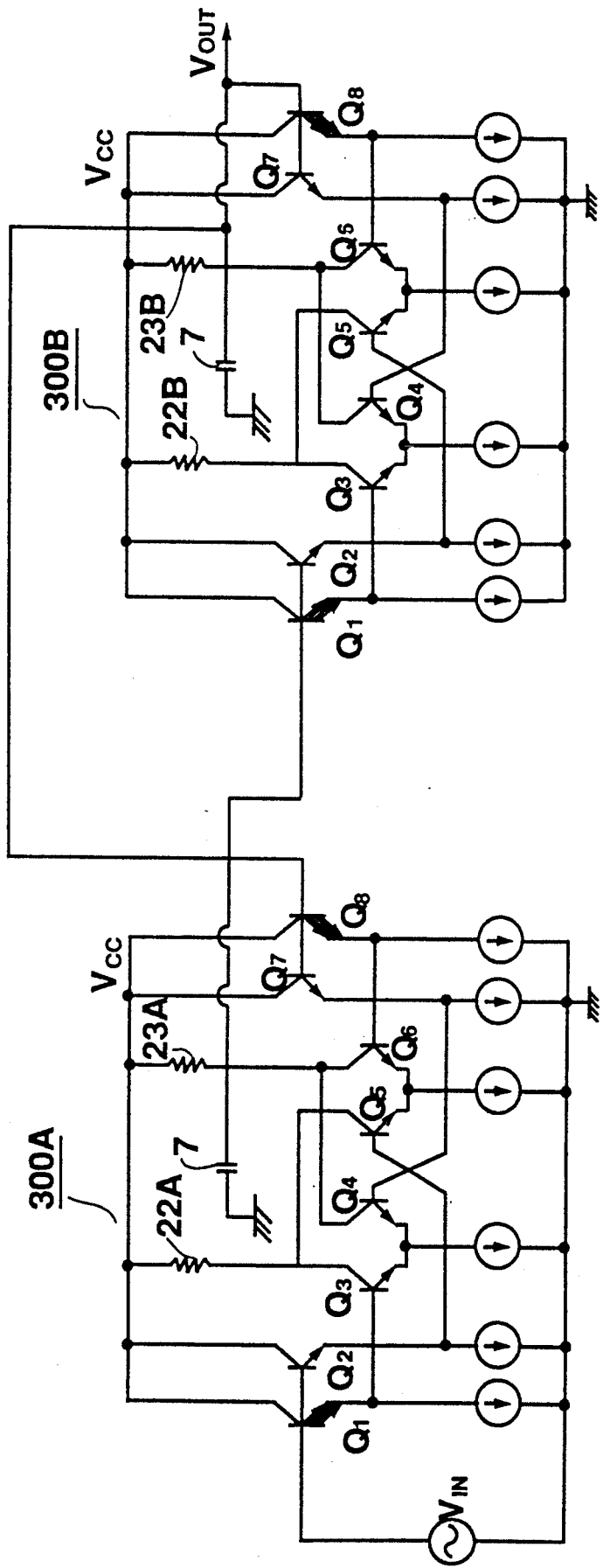
FIG. 11 is a circuit diagram of a bandpass filter 1200 having a single input/output according to variation of the bandpass filter 1000 shown in FIG. 7; and, FIGS. 12 and 13 are circuit diagrams of bandpass filters 3000 and 4000 according to the invention.

Furthermore, in FIG. 11, there is represented another filter circuit 1200 belonging to the bandpass filter 1000 shown in FIG. 7.

A feature of this bandpass filter 1200 is a single input and a single output, which is different from the bandpass filter 1000 shown in FIG. 7 in which the signal transmission/reception is effected by all differential input/output modes. It is apparent that even such a single input/output mode bandpass filter 1200 still has the above-described advantages, as compared with the conventional bandpass filter.

Since the circuit arrangement of the single input/output type bandpass filter 1200 is the substantially same as that of the dual input/output type bandpass filter 1000, no further explanation is made in the specification.

Figure 12:
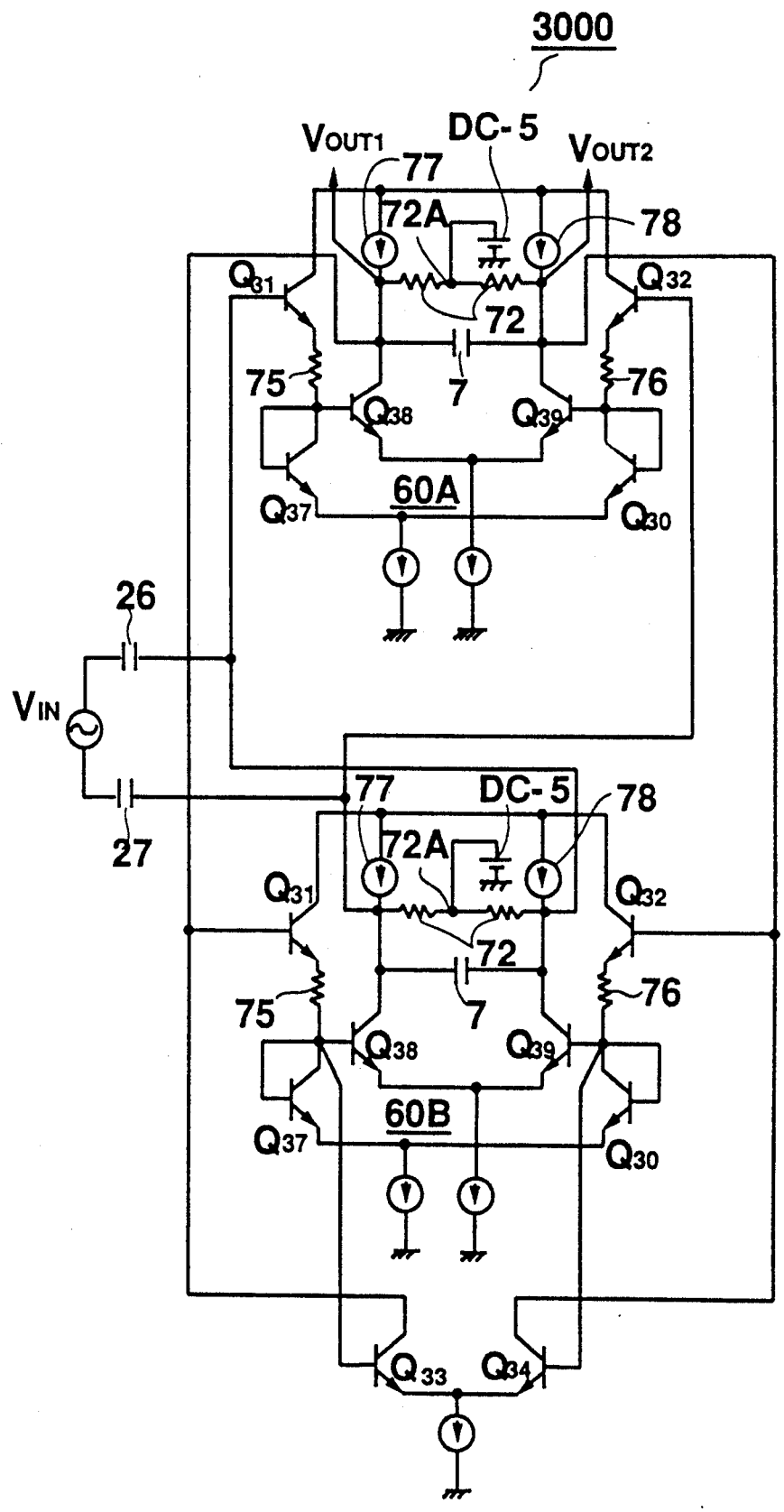

FIG. 12 represents another bandpass filter 3000 according to the present invention. That is to say, this bandpass filter 3000 is constructed of a pair of integrator circuits 60A and 60B. Each of these integrator circuits 60A and 60B employs transistors $Q_{37}$, $Q_{38}$, $Q_{39}$, $Q_{30}$, $Q_{31}$ and $Q_{32}$, and also resistors 75 and 76 functioning as a gain cell. Resistors 72 for compensating the phase characteristic of this filter 3000 are connected parallel to the capacitor 7 in the respective integrator circuits 60A and 60B. Furthermore, a DC bias voltage source DC-5 is connected to a central point between two phase compensating resistors 72, so as to prevent a DC voltage drop across the load (i.e., the collector current sources 77 and 78 in FIG. 12) from which the differential output can be obtained. An input voltage "$V_{IN}$" is input by means of a capacitance division by two input capacitors 26 and 27. Transistors $Q_{33}$ and $Q_{34}$ constitute termination resistors.

In accordance with features of this bandpass filter 3000 employing the gain cells, the DC potentials at the loads can be made stable, and this filter can be arranged in all differential arrangement mode, so that the overall frequency characteristic can be improved.

Figure 13:
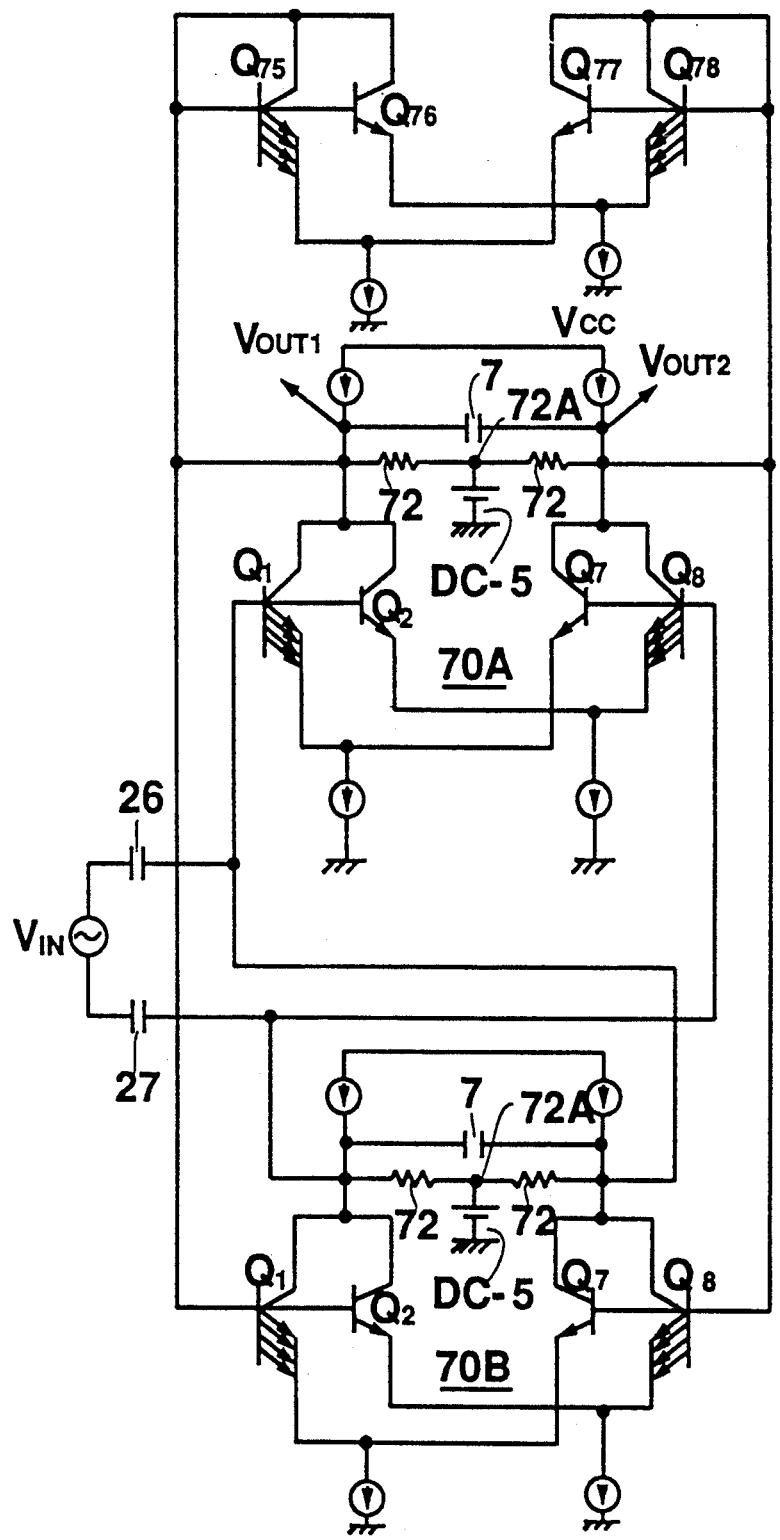

In FIG. 13, there is shown a still further bandpass filter 4000 according to the invention. As clearly shown in FIG. 13, this bandpass filter 4000 is constructed of differential amplifiers whose linearity characteristics are improved without any emitter followers. These differential amplifiers employ the transistors $Q_2$: $Q_7$ and $Q_1$:$Q_8$ having a ratio of emitter areas of 1:4, similar to the first preferred embodiment shown in FIG. 4A. One pair of integrator circuits 70A and 70B are arranged by these differential amplifiers. In addition to these integrator circuits 70A and 70B, this bandpass filter 4000 further employs the phase compensating resistors 72 connected parallel to the respective capacitors 7 of these integrator circuits 70A and 70B, and also the DC bias voltage sources DC-5, which are similar to the previous bandpass filter 3000 shown in FIG. 12. The input signal "$V_{IN}$" is input by means of the capacitance division by two input capacitors 26 and 27. A termination resistor network 70 constructed of four bipolar transistors $Q_{75}$ to $Q_{78}$ having a ratio of emitter areas of 1:4 is connected to the first integrator circuit 70A.

In accordance with features of this bandpass filter 4000, the overall frequency characteristic of this bandpass filter 4000 can be improved with a simpler circuit arrangement.

While has been described in detail, in the differential amplifier circuits according to the present invention, the linearity can be improved in such a manner that the emitter areas of the transistors employed in the emitter-coupled transistor pairs are the substantially same with each other, the DC voltages having the different values are superimposed to the AC signal applied to the base electrodes of these transistors by the drive means so as to offset the collector currents thereof, the offset collector currents are multiplied with each other, and then the multiplied currents are output as the differential output. As a result, the mutual conductance "gm" is variable. Furthermore, since the integrator circuit according to the preferred embodiment is arranged by employing a single stage of the above-described differential amplifier circuit with the capacitor load, the frequency characteristic of the integrator circuit can be improved and the higher transconductance "Gm" can be achieved. As no resistor is connected to the emitter circuits of the transistors for constituting the differential amplifier circuit, the transconductance "Gm" of the integrator circuit is inversely proportional to the absolute temperature. Consequently, if the current of the current source of the emitter is directly proportional to the absolute temperature, the temperature dependent characteristic of the transconductance "Gm" can be cancelled so that the characteristics of the integrator circuit can be stabilized.

Furthermore, the following advantages of the present invention are achieved.

That is, since the load of the collector circuit of the differential amplifier circuit from which the differential output is derived is constructed of the resistor, or the resistor having the positive resistance with the parallel-connected resistor having the negative resistance, the DC gain can be set to a desired value so as to cancel the adverse influence of the second pole of the differential amplifier circuit. As a result, the frequency characteristic thereof can be furthermore improved.

In accordance with other features, the quality factor of the active filter can be readily controller by adjusting the currents of the emitter followers connected to the input stages of the integrator circuits in this active filter, a change in the quality factor due to the parameters of the circuit elements can be suppressed.

What is claimed is:

1. An integrator circuit comprising:
   a first emitter-coupled transistor pair having two bipolar transistors, emitter areas of said transistors being substantially equal to each other;
   a second emitter-coupled transistor pair having two bipolar transistors, emitter areas of said transistors being substantially equal to each other;
   first and second input terminals for receiving an input voltage respectively;
   a first output terminal to which a first collector of said first emitter-coupled pair and also a first collector of said second emitter-coupled transistor pair are commonly connected;
   a second output terminal to which a second collector of said first emitter-coupled transistor pair and also a second collector of said second emitter coupled transistor pair are commonly connected;
   first DC-voltage applying means connected to said first input terminal, for applying a first offset DC (direct current) voltage having a predetermined level between a first base electrode of said first emitter-coupled transistor pair and a first base electrode of said second emitter-coupled transistor pair;
   second DC-voltage applying means connected to said second input terminal, for applying a second offset DC voltage having the same level but an opposite polarity to that of said first offset DC voltage between a second base electrode of said first emitter-coupled transistor pair and a second base electrode of said second emitter-coupled transistor pair; and,
   capacitance means connected between said first and second output terminals.

2. An integrator circuit as claimed in claim 1, wherein said first DC-voltage applying means is constructed of one pair of emitter followers, and said second DC-voltage applying means is constructed of another pair of emitter followers.

3. An integrator circuit as claimed in claim 2, herein said pair of first emitter followers includes two bipolar transistors having a ratio of emitter areas of 1:4, and also said pair of second emitter followers includes two bipolar transistors having a ratio of emitter areas of 1:4.

4. An integrator circuit as claimed in claim 1, wherein a first collector current source is connected via said first output terminal to a first junction between said first collector of said first emitter-coupled transistor pair and said first collector of said second emitter-coupled transistor pair, and a second collector current source is connected via said second output terminal to a second junction between said second collector of said first emitter-coupled transistor pair and said second collector of said second emitter-coupled transistor pair.

5. An integrator circuit as claimed in claim 4, wherein said first collector current source and second collector current source are constructed of two bipolar transistors and a first bias DC power source.

6. An integrator circuit as claimed in claim 4, wherein said first collector current source and second collector current source are constructed of first and second resistors each having a positive resistance value.

7. An integrator circuit as claimed in claim 6, further comprising:
   a negative resistor circuit connected parallel to said first and second resistors, and constructed of at least a pair of bipolar transistors and a third resistor.

8. An integrator circuit as claimed in claim 7, further comprising;
   first to fourth diodes connected to corresponding emitters of said bipolar transistors of said first and second emitter-coupled transistor pairs.

9. An integrator circuit as claimed in claim 4, further comprising:
   a resistor for compensating for a phase characteristic of the integrator circuit connected parallel to said capacitor; and,
   a DC bias voltage source connected between a resistance-dividing point of the resistor and a ground line, for preventing DC voltage drops across the first and second collector current sources functioning as loads for the integrator circuit.

10. An integrator circuit comprising:
    first and second input terminals for receiving an input voltage respectively;
    an n-set ("n" being an integer equal to, or more than 2) of emitter-coupled transistor pairs, each having two bipolar transistors, emitter areas of said transistors being substantially equal to each other;
    an emitter current source commonly connected to all of emitters of said emitter-coupled transistor pairs;
    first and second output terminals connected to two collectors of one set of said emitter-coupled transistor pair;
    drive means connected between said first and second input terminals, and said n-set of emitter-coupled transistor pairs, for producing an n-piece of AC (alternating current) signals having the same phase with each other but different amplitudes, to which different DC voltages have been superimposed, from said input signal, and for supplying said n-piece of AC signals to each base electrode of said n-set of emitter-coupled transistor pairs; and,
    capacitance means connected between said first and second output terminals.

11. An integrator circuit as claimed in claim 10, wherein said drive means are constructed of 2n pieces of emitter followers connected to corresponding base electrodes of said n-set of emitter-coupled transistor pairs, said first n pieces of emitter followers includes an n-piece of bipolar transistors having different emitter areas with each other, and said second n pieces of emitter followers includes an n-piece of bipolar transistors having different emitter areas with each other, whereby said DC voltages superimposed to said AC signal supplied to each base electrode of said n-set of emitter-coupled transistor pair are different from each other.

12. An integrator circuit as claimed in claim 11, wherein a ratio of said emitter areas of each bipolar transistors is selected to be 1:5.

13. An integrator circuit as claimed in claim 10, wherein a first collector current source is connected via said first output terminal to a first collector of one set of said emitter-coupled transistor pair, and a second collector current source is connected via said second output terminal to a second collector thereof.

14. An integrator circuit as claimed in claim 13, wherein said first collector current source and second collector current source are constructed of two bipolar transistors and a first bias DC power source.

15. An integrator circuit as claimed in claim 13, wherein said first collector current source and second collector current source are constructed of first and second resistors each having a positive resistance value.

16. An integrator circuit as claimed in claim 13, further comprising:
a negative resistor circuit connected parallel to said first and second resistors, and constructed of at least a pair of bipolar transistors and a third resistor.

17. An integrator circuit as claimed in claim 16, further comprising;
first to fourth diodes series-connected to corresponding emitters of said bipolar transistors of said emitter-coupled transistor pairs.

18. An integrator circuit as claimed in claim 16, further comprising:
2n pieces of diodes series-connected to corresponding emitters of said emitter-coupled pairs.

19. An integrator circuit as claimed in claim 13, further comprising:
a resistor for compensating for a phase characteristic of the integrator circuit connected parallel to said capacitor; and,
a DC bias voltage source connected between a resistance-dividing point of the resistor and a ground line, for preventing DC voltage drops across the first and second collector current sources functioning as loads for the integrator circuit.

20. An active filter comprising:
input terminal means constructed of capacitive dividing elements for receiving an input signal and for capacitive-dividing said input signal into first and second input signals;
first and second integrator circuits for receiving said first and second input signals, each of said first and second integrator circuits being constructed of:
a first emitter-coupled transistor pair having two bipolar transistors, emitter areas of said transistors being substantially equal to each other;
a second emitter-coupled transistor pair having two bipolar transistors, emitter areas of said transistors being substantially equal to each other;
a first output terminal to which a first collector of said first emitter-coupled pair and also a first collector of said second emitter-coupled transistor pair are commonly connected;
a second output terminal to which a second collector of said first emitter-coupled transistor pair and also a second collector of said second emitter-coupled transistor pair are commonly connected;
first DC-voltage applying means connected to said input terminal means, for applying a first offset DC (direct current) voltage having a predetermined level between a first base electrode of said first emitter-coupled transistor pair and a first base electrode of said second emitter-coupled transistor pair;
second DC-voltage applying means connected to said input terminal means, for applying a second offset DC voltage having the same level but an opposite polarity to that of said first offset DC voltage between a second base electrode of said first emitter-coupled transistor pair and a second base electrode of said second emitter-coupled transistor pair;
capacitance means connected between said first and second output terminals; and,
termination means connected to said second integrator circuit.

21. An active filter as claimed in claim 20, wherein said active filter is a bandpass filter and said termination means is constructed of four bipolar transistors and two constant current sources.

22. An active filter as claimed in claim 20, wherein two resistors are connected as collector loads, to said first collectors of said first and second emitter-coupled transistor pairs.

23. An active filter as claimed in claim 18, wherein said input signal is directly supplied to said first integrator circuit and the second output terminal thereof is connected to said second integrator circuit.

24. An active filter comprising:
input terminal means constructed of capacitive dividing elements for receiving an input signal and for capacitive-dividing said input signal into first and second input signals;
first and second integrator circuits for receiving said first and second input signals, each of said first and second integrator circuits being constructed of:
an n-set ("n" being an integer equal to, or more than 2) of emitter-coupled transistor pairs, each having two bipolar transistors, emitter areas of said transistors, being substantially equal to each other;
an emitter current source commonly connected to all of emitters of said emitter-coupled transistor pairs;
first and second output terminals connected to two collectors of one set of said emitter-coupled transistor pair;
drive means connected to said terminal means, and said n-set of emitter-coupled transistor pairs, for producing an n-piece of AC (alternating current) signals having the same phase with each other but different amplitudes, to which different DC voltages have been superimposed, from said input signal, and for supplying said n-piece of AC signals to each base electrode of said n-set of emitter-coupled transistor pairs;
capacitance means connected between said first and second output terminals; and
termination means connected to said second integrator circuit.

25. An active filter as claimed in claim 22, wherein said active filter is a bandpass filter and said termination means is constructed of from bipolar transistors and one constant current source.

26. An active filter as claimed in claim 22, wherein two resistors are connected as collector loads to said first collectors of said emitter-coupled transistor pair.

27. A bandpass filter comprising:
first and second integrator circuits each having gain cells of differential amplifiers constructed of six bipolar transistors and resistors, and a capacitor;
a resistor for compensating for a phase characteristic of the respective integrator circuits connected parallel to said capacitor; and,
a DC bias voltage source connected between each of resistance-dividing points of the resistors and a ground line, for preventing a DC voltage drop across each of loads of the respective integrator circuits.

28. A bandpass filter comprising:
first and second integrator circuits each having differential amplifiers constructed of bipolar transistors a ratio of which emitter areas being selected to be 1:4, and each having a capacitor;

a resistor for compensating for a phase characteristic of the respective integrator circuits connected parallel to said capacitor;

a DC bias voltage source connected between each of resistance-dividing points of the resistors and a ground line, for preventing a DC voltage drop across each of loads of the respective integrator circuits; and a termination resistor network connected to the first integrator circuit and constructed of bipolar transistors, a ratio of which emitter areas being selected to be 1:4.

29. A differential amplifier comprising:

first and second input terminals for receiving an input voltage respectively;

an n-set ("n" being an integer equal to, or more than 2) emitter-coupled transistor pairs, each having two bipolar transistors, emitter areas of said transistors being substantially equal to each other;

an emitter current source commonly coupled to all of emitters of said emitter-coupled transistor pairs; and, drive means connected between said first and second input terminals, and said n-set of emitter-coupled transistor pairs, for producing an n-piece of AC (alternating current) signals having the same phase with each other but different amplitudes, to which different DC voltages have been superimposed, from said input signal, and for supplying said n-piece of AC signals to each base electrode of said n-set of emitter-coupled transistor pairs.

* * * * *